United States Patent
Hunter

(10) Patent No.: US 6,767,751 B2
(45) Date of Patent: Jul. 27, 2004

(54) INTEGRATED DRIVER PROCESS FLOW

(75) Inventor: James A. Hunter, Campbell, CA (US)

(73) Assignee: Silicon Light Machines, Inc., Sunnyvale, CA (US)

(*) Notice: Subject to any disclaimer, the term of this patent is extended or adjusted under 35 U.S.C. 154(b) by 29 days.

(21) Appl. No.: 10/161,191

(22) Filed: May 28, 2002

(65) Prior Publication Data

US 2003/0235932 A1 Dec. 25, 2003

(51) Int. Cl.[7] .......................................... H01L 21/00
(52) U.S. Cl. ......................... 438/5; 438/29; 438/128; 438/745; 438/142
(58) Field of Search .......................... 438/29, 32, 5, 438/6–7, 10, 128, 745, 756; 216/2

(56) References Cited

U.S. PATENT DOCUMENTS

| | | | |
|---|---|---|---|
| 1,525,550 A | 2/1925 | Jenkins | |
| 1,548,262 A | 8/1925 | Freedman | |
| RE16,767 E | 10/1927 | Jenkins | |
| 1,814,701 A | 4/1931 | Ives | |
| 2,415,226 A | 4/1947 | Sziklai | 178/5.4 |
| 2,783,406 A | 2/1957 | Vanderhooft | 313/70 |
| 2,920,529 A | 1/1960 | Blythe | 88/73 |
| 2,991,690 A | 7/1961 | Grey et al. | 88/16.6 |
| RE25,169 E | 5/1962 | Glenn | |
| 3,256,465 A | 6/1966 | Weissenstern et al. | 317/101 |
| 3,388,301 A | 6/1968 | James | 317/234 |
| 3,443,871 A | 5/1969 | Chitayat | 356/106 |
| 3,553,364 A | 1/1971 | Lee | 178/7.3 |
| 3,576,394 A | 4/1971 | Lee | 178/7.3 |
| 3,600,798 A | 8/1971 | Lee | 29/592 |
| 3,656,837 A | 4/1972 | Sandbank | 350/161 |
| 3,657,610 A | 4/1972 | Yamamoto et al. | 317/243 |
| 3,693,239 A | 9/1972 | Dix | 29/470 |
| 3,743,507 A | 7/1973 | Ih et al. | 96/81 |
| 3,752,563 A | 8/1973 | Torok et al. | 350/151 |
| 3,781,465 A | 12/1973 | Ernstoff et al. | 178/5.4 BD |
| 3,783,184 A | 1/1974 | Ernstoff et al. | 178/5.4 BD |

(List continued on next page.)

FOREIGN PATENT DOCUMENTS

| | | | | |
|---|---|---|---|---|
| DE | 32 33 195 A1 | 3/1983 | | H01L/23/52 |
| DE | 43 23 799 A1 | 1/1994 | | H01L/23/50 |

(List continued on next page.)

OTHER PUBLICATIONS

US 6,563,972, 5/2003, Weaver et al. (withdrawn)
V.S. Aliev et al., "Development of Si(100) surface roughness at the intial stage of etching in $F_2$ and $XeF_2$ gases: ellipsometric study," Surface Science 442 (1999), pp. 206–214.

(List continued on next page.)

Primary Examiner—Savitri Mulpuri
(74) Attorney, Agent, or Firm—Okamoto & Benedicto LLP

(57) ABSTRACT

An integrated device including one or more device drivers and a diffractive light modulator monolithically coupled to the one or more driver circuits. The one or more driver circuits are configured to process received control signals and to transmit the processed control signals to the diffractive light modulator. A method of fabricating the integrated device preferably comprises fabricating a front-end portion for each of a plurality of transistors, isolating the front-end portions of the plurality of transistors, fabricating a front-end portion of a diffractive light modulator, isolating the front end portion of the diffractive light modulator, fabricating interconnects for the plurality of transistors, applying an open array mask and wet etch to access the diffractive light modulator, and fabricating a back-end portion of the diffractive light modulator, thereby monolithically coupling the diffractive light modulator and the plurality of transistors.

12 Claims, 7 Drawing Sheets

U.S. PATENT DOCUMENTS

| | | | |
|---|---|---|---|
| 3,792,916 A | 2/1974 | Sarna | 350/163 |
| 3,802,769 A | 4/1974 | Rotz et al. | 352/43 |
| 3,811,186 A | 5/1974 | Larnerd et al. | 29/626 |
| 3,861,784 A | 1/1975 | Torok | 350/162 R |
| 3,862,360 A | 1/1975 | Dill et al. | 178/7.3 D |
| 3,871,014 A | 3/1975 | King et al. | 357/67 |
| 3,886,310 A | 5/1975 | Guldberg et al. | 178/7.5 D |
| 3,896,338 A | 7/1975 | Nathanson et al. | 315/373 |
| 3,915,548 A | 10/1975 | Opttek | 350/3.5 |
| 3,935,499 A | 1/1976 | Oess | 313/413 |
| 3,935,500 A | 1/1976 | Oess et al. | 313/495 |
| 3,938,881 A | 2/1976 | Biegelsen et al. | 350/161 |
| 3,941,456 A | 3/1976 | Schilz et al. | 350/161 |
| 3,942,245 A | 3/1976 | Jackson et al. | 29/591 |
| 3,943,281 A | 3/1976 | Keller et al. | 178/7.5 D |
| 3,947,105 A | 3/1976 | Smith | 353/121 |
| 3,969,611 A | 7/1976 | Fonteneau | 219/502 |
| 3,980,476 A | 9/1976 | Wysocki | 96/1.1 |
| 3,991,416 A | 11/1976 | Byles et al. | 340/324 R |
| 4,001,663 A | 1/1977 | Bray | 321/2 |
| 4,004,849 A | 1/1977 | Shattuck | 350/160 R |
| 4,006,968 A | 2/1977 | Ernstoff et al. | 350/160 LC |
| 4,009,939 A | 3/1977 | Okano | 350/162 SF |
| 4,011,009 A | 3/1977 | Lama et al. | 350/162 R |
| 4,012,116 A | 3/1977 | Yevick | 350/132 |
| 4,012,835 A | 3/1977 | Wallick | 29/591 |
| 4,017,158 A | 4/1977 | Booth | 350/162 SF |
| 4,020,381 A | 4/1977 | Oess et al. | 313/302 |
| 4,021,766 A | 5/1977 | Aine | 338/2 |
| 4,034,211 A | 7/1977 | Horst et al. | 235/61.12 N |
| 4,034,399 A | 7/1977 | Drukier et al. | 357/68 |
| 4,035,068 A | 7/1977 | Rawson | 353/122 |
| 4,067,129 A | 1/1978 | Abramson et al. | 40/563 |
| 4,084,437 A | 4/1978 | Finnegan | 73/361 |
| 4,090,219 A | 5/1978 | Ernstoff et al. | 358/59 |
| 4,093,346 A | 6/1978 | Nishino et al. | 350/162 SF |
| 4,093,921 A | 6/1978 | Buss | 325/459 |
| 4,093,922 A | 6/1978 | Buss | 325/459 |
| 4,100,579 A | 7/1978 | Ernstoff | 358/230 |
| 4,103,273 A | 7/1978 | Keller | 338/2 |
| 4,126,380 A | 11/1978 | Borm | 350/266 |
| 4,127,322 A | 11/1978 | Jacobson et al. | 353/31 |
| 4,135,502 A | 1/1979 | Peck | 128/76.5 |
| 4,139,257 A | 2/1979 | Matsumoto | 350/6.1 |
| 4,143,943 A | 3/1979 | Rawson | 350/120 |
| 4,163,570 A | 8/1979 | Greenaway | 283/8 A |
| 4,184,700 A | 1/1980 | Greenaway | 283/6 |
| 4,185,891 A | 1/1980 | Kaestner | 350/167 |
| 4,190,855 A | 2/1980 | Inoue | 357/80 |
| 4,195,915 A | 4/1980 | Lichty et al. | 350/345 |
| 4,205,428 A | 6/1980 | Ernstoff et al. | 29/592 R |
| 4,211,918 A | 7/1980 | Nyfeler et al. | 235/454 |
| 4,223,050 A | 9/1980 | Nyfeler et al. | 427/163 |
| 4,225,913 A | 9/1980 | Bray | 363/97 |
| 4,249,796 A | 2/1981 | Sincerbox et al. | 350/370 |
| 4,250,217 A | 2/1981 | Greenaway | 428/161 |
| 4,250,393 A | 2/1981 | Greenaway | 250/566 |
| 4,256,787 A | 3/1981 | Shaver et al. | 428/1 |
| 4,257,016 A | 3/1981 | Kramer, Jr. et al. | 322/7.51 |
| 4,290,672 A | 9/1981 | Whitefield | 350/358 |
| 4,295,145 A | 10/1981 | Latta | 346/108 |
| 4,311,999 A | 1/1982 | Upton et al. | 340/755 |
| 4,327,411 A | 4/1982 | Turner | 364/900 |
| 4,327,966 A | 5/1982 | Bloom | 350/162 R |
| 4,331,972 A | 5/1982 | Rajchman | 358/60 |
| 4,336,982 A | 6/1982 | Rector, Jr. | 350/358 |
| 4,338,660 A | 7/1982 | Kelley et al. | 364/200 |
| 4,343,535 A | 8/1982 | Bleha, Jr. | 350/342 |
| 4,346,965 A | 8/1982 | Sprague et al. | 350/358 |
| 4,348,079 A | 9/1982 | Johnson | 350/358 |
| 4,355,463 A | 10/1982 | Burns | 29/827 |
| 4,361,384 A | 11/1982 | Bosserman | 350/174 |
| 4,369,524 A | 1/1983 | Rawson et al. | 455/606 |
| 4,374,397 A | 2/1983 | Mir | 358/75 |
| 4,389,096 A | 6/1983 | Hori et al. | 350/339 R |
| 4,391,490 A | 7/1983 | Hartke | 350/356 |
| 4,396,246 A | 8/1983 | Holman | 350/96.14 |
| 4,398,798 A | 8/1983 | Krawczak et al. | 350/162.24 |
| 4,400,740 A | 8/1983 | Traino et al. | 358/293 |
| 4,408,884 A | 10/1983 | Kleinknecht et al. | 356/355 |
| 4,414,583 A | 11/1983 | Hooker, III | 358/300 |
| 4,417,386 A | 11/1983 | Exner | 29/590 |
| 4,418,397 A | 11/1983 | Brantingham et al. | 364/900 |
| 4,420,717 A | 12/1983 | Wallace et al. | 318/696 |
| 4,422,099 A | 12/1983 | Wolfe | 358/293 |
| 4,426,768 A | 1/1984 | Black et al. | 29/583 |
| 4,430,584 A | 2/1984 | Someshwar et al. | 307/465 |
| 4,435,041 A | 3/1984 | Torok et al. | 350/162.24 |
| 4,440,839 A | 4/1984 | Mottier | 430/2 |
| 4,443,819 A | 4/1984 | Funada et al. | 358/236 |
| 4,443,845 A | 4/1984 | Hamilton et al. | 364/200 |
| 4,447,881 A | 5/1984 | Brantingham et al. | 364/488 |
| 4,454,591 A | 6/1984 | Lou | 364/900 |
| 4,456,338 A | 6/1984 | Gelbart | 350/358 |
| 4,460,907 A | 7/1984 | Nelson | 346/153.1 |
| 4,462,046 A | 7/1984 | Spight | 358/101 |
| 4,467,342 A | 8/1984 | Tower | 357/30 |
| 4,468,725 A | 8/1984 | Venturini | 363/160 |
| 4,483,596 A | 11/1984 | Marshall | 350/385 |
| 4,484,188 A | 11/1984 | Ott | 340/728 |
| 4,487,677 A | 12/1984 | Murphy | 204/247 |
| 4,492,435 A | 1/1985 | Banton et al. | 350/360 |
| 4,503,494 A | 3/1985 | Hamilton et al. | 364/200 |
| 4,511,220 A | 4/1985 | Scully | 350/403 |
| 4,538,883 A | 9/1985 | Sprague et al. | 350/356 |
| 4,545,610 A | 10/1985 | Lakritz et al. | 29/589 |
| 4,556,378 A | 12/1985 | Nyfeler et al. | 425/143 |
| 4,558,171 A | 12/1985 | Gantley et al. | 174/52 FP |
| 4,561,044 A | 12/1985 | Ogura et al. | 362/84 |
| 4,566,935 A | 1/1986 | Hornbeck | 156/626 |
| 4,567,585 A | 1/1986 | Gelbart | 369/97 |
| 4,571,041 A | 2/1986 | Gaudyn | 353/10 |
| 4,571,603 A | 2/1986 | Hornbeck et al. | 346/160 |
| 4,577,932 A | 3/1986 | Gelbart | 350/358 |
| 4,577,933 A | 3/1986 | Yip et al. | 350/358 |
| 4,588,957 A | 5/1986 | Balant et al. | 330/4.3 |
| 4,590,548 A | 5/1986 | Maytum | 363/161 |
| 4,594,501 A | 6/1986 | Culley et al. | 219/492 |
| 4,596,992 A | 6/1986 | Hornbeck | 346/76 PH |
| 4,615,595 A | 10/1986 | Hornbeck | 353/122 |
| 4,623,219 A | 11/1986 | Trias | 350/351 |
| 4,636,039 A | 1/1987 | Turner | 350/356 |
| 4,636,866 A | 1/1987 | Hattori | 358/236 |
| 4,641,193 A | 2/1987 | Glenn | 358/233 |
| 4,645,881 A | 2/1987 | LeToumelin et al. | 379/252 |
| 4,646,158 A | 2/1987 | Ohno et al. | 358/236 |
| 4,649,085 A | 3/1987 | Landram | 428/620 |
| 4,649,432 A | 3/1987 | Watanabe | 358/241 |
| 4,652,932 A | 3/1987 | Miyajima et al. | 358/236 |
| 4,655,539 A | 4/1987 | Caulfield et al. | 350/3.6 |
| 4,660,938 A | 4/1987 | Kazan | 350/355 |
| 4,661,828 A | 4/1987 | Miller, Jr. et al. | 346/108 |
| 4,662,746 A | 5/1987 | Hornbeck | 350/269 |
| 4,663,670 A | 5/1987 | Ito et al. | 358/245 |
| 4,687,326 A | 8/1987 | Corby, Jr. | 356/5 |
| 4,698,602 A | 10/1987 | Armitage | 332/7.51 |
| 4,700,276 A | 10/1987 | Freyman et al. | 361/403 |
| 4,707,064 A | 11/1987 | Dobrowolski et al. | 350/96.19 |
| 4,709,995 A | 12/1987 | Kuribayashi et al. | 350/350 |
| 4,710,732 A | 12/1987 | Hornbeck | 332/7.51 |
| 4,711,526 A | 12/1987 | Hennings et al. | 350/170 |

| | | | | | |
|---|---|---|---|---|---|
| 4,714,326 A | 12/1987 | Usui et al. ................. 350/485 | 5,031,144 A | 7/1991 | Persky |
| 4,717,066 A | 1/1988 | Goldenberg et al. ........ 228/179 | 5,035,473 A | 7/1991 | Kuwayama et al. ......... 350/3.7 |
| 4,719,507 A | 1/1988 | Bos .............................. 358/92 | 5,037,173 A | 8/1991 | Sampsell et al. ............. 385/17 |
| 4,721,629 A | 1/1988 | Sakai et al. .................... 427/35 | 5,039,628 A | 8/1991 | Carey ......................... 437/183 |
| 4,722,593 A | 2/1988 | Shimazaki ................... 350/336 | 5,040,052 A | 8/1991 | McDavid ..................... 357/80 |
| 4,724,467 A | 2/1988 | Yip et al. ..................... 355/71 | 5,041,395 A | 8/1991 | Steffen ....................... 437/206 |
| 4,728,185 A | 3/1988 | Thomas ...................... 353/122 | 5,041,851 A | 8/1991 | Nelson ....................... 349/160 |
| 4,743,091 A | 5/1988 | Gelbart ....................... 350/252 | 5,043,917 A | 8/1991 | Okamoto ................... 364/518 |
| 4,744,633 A | 5/1988 | Sheiman ..................... 350/132 | 5,048,077 A | 9/1991 | Wells et al. .................. 379/96 |
| 4,747,671 A | 5/1988 | Takahashi et al. .......... 350/336 | 5,049,901 A | 9/1991 | Gelbart ....................... 346/108 |
| 4,751,509 A | 6/1988 | Kubota et al. ............... 340/784 | 5,058,992 A | 10/1991 | Takahashi ................... 359/567 |
| 4,761,253 A | 8/1988 | Antes ........................... 264/1.3 | 5,060,058 A | 10/1991 | Goldenberg et al. ........... 358/60 |
| 4,763,975 A | 8/1988 | Scifres et al. ............. 350/96.15 | 5,061,049 A | 10/1991 | Hornbeck .................... 359/224 |
| 4,765,865 A | 8/1988 | Gealer et al. ............... 156/647 | 5,066,614 A | 11/1991 | Dunaway et al. ............ 437/209 |
| 4,772,094 A | 9/1988 | Sheiman ..................... 350/133 | 5,068,205 A | 11/1991 | Baxter et al. ................ 437/205 |
| 4,797,694 A | 1/1989 | Agostinelli et al. .......... 346/160 | 5,072,239 A | 12/1991 | Mitcham et al. ............. 346/108 |
| 4,797,918 A | 1/1989 | Lee et al. ...................... 380/20 | 5,072,418 A | 12/1991 | Boutaud et al. ........ 364/715.06 |
| 4,801,194 A | 1/1989 | Agostinelli et al. .......... 350/356 | 5,074,947 A | 12/1991 | Estes et al. ............... 156/307.3 |
| 4,803,560 A | 2/1989 | Matsunaga et al. .......... 359/236 | 5,075,940 A | 12/1991 | Kuriyama et al. .......... 29/25.03 |
| 4,804,641 A | 2/1989 | Arlt et al. .................... 437/227 | 5,079,544 A | 1/1992 | DeMond et al. ............. 340/701 |
| 4,807,021 A | 2/1989 | Okumura ...................... 357/75 | 5,081,617 A | 1/1992 | Gelbart ....................... 369/112 |
| 4,807,965 A | 2/1989 | Garakani .................... 350/131 | 5,083,857 A | 1/1992 | Hornbeck .................... 359/291 |
| 4,809,078 A | 2/1989 | Yabe et al. .................. 358/236 | 5,085,497 A | 2/1992 | Um et al. .................... 359/848 |
| 4,811,082 A | 3/1989 | Jacobs et al. .................. 357/80 | 5,089,903 A | 2/1992 | Kuwayama et al. ........... 359/15 |
| 4,811,210 A | 3/1989 | McAulay .................... 364/200 | 5,093,281 A | 3/1992 | Eshima ....................... 437/217 |
| 4,814,759 A | 3/1989 | Gombrich et al. ........... 340/771 | 5,096,279 A | 3/1992 | Hornbeck et al. ........... 359/230 |
| 4,817,850 A | 4/1989 | Wiener-Avnear et al. ... 228/119 | 5,099,353 A | 3/1992 | Hornbeck .................... 359/291 |
| 4,824,200 A | 4/1989 | Isono et al. ............... 350/96.16 | 5,101,184 A | 3/1992 | Antes ......................... 235/454 |
| 4,827,391 A | 5/1989 | Sills ............................ 363/41 | 5,101,236 A | 3/1992 | Nelson et al. ............... 355/229 |
| 4,829,365 A | 5/1989 | Eichenlaub .................... 358/3 | 5,103,334 A | 4/1992 | Swanberg ................... 359/197 |
| 4,836,649 A | 6/1989 | Ledebuhr et al. ........ 350/331 R | 5,105,207 A | 4/1992 | Nelson ....................... 346/160 |
| 4,856,863 A | 8/1989 | Sampsell et al. ......... 350/96.16 | 5,105,299 A | 4/1992 | Anderson et al. ........... 359/223 |
| 4,856,869 A | 8/1989 | Sakata et al. ........... 350/162.18 | 5,105,369 A | 4/1992 | Nelson ....................... 364/525 |
| 4,859,012 A | 8/1989 | Cohn ...................... 350/96.24 | 5,107,372 A | 4/1992 | Gelbart et al. .............. 359/824 |
| 4,859,060 A | 8/1989 | Katagiri et al. ............. 356/352 | 5,112,436 A | 5/1992 | Bol ............................ 156/643 |
| 4,866,488 A | 9/1989 | Frensley ........................ 357/4 | 5,113,272 A | 5/1992 | Reamey ....................... 359/53 |
| 4,882,683 A | 11/1989 | Rupp et al. .................. 364/521 | 5,113,285 A | 5/1992 | Franklin et al. ............. 359/465 |
| 4,893,509 A | 1/1990 | MacIver et al. ........ 73/517 AV | 5,115,344 A | 5/1992 | Jaskie ........................ 359/573 |
| 4,896,325 A | 1/1990 | Coldren ....................... 372/20 | 5,119,204 A | 6/1992 | Hashimoto et al. ......... 358/254 |
| 4,896,948 A | 1/1990 | Dono et al. .................. 350/355 | 5,121,343 A | 6/1992 | Faris .......................... 395/111 |
| 4,897,708 A | 1/1990 | Clements ..................... 357/65 | 5,126,812 A | 6/1992 | Greiff .......................... 357/25 |
| 4,902,083 A | 2/1990 | Wells ......................... 350/6.6 | 5,126,826 A | 6/1992 | Kauchi et al. ................. 357/72 |
| 4,915,463 A | 4/1990 | Barbee, Jr. ................... 350/1.1 | 5,126,836 A | 6/1992 | Um ............................. 358/60 |
| 4,915,479 A | 4/1990 | Clarke ........................ 350/345 | 5,128,660 A | 7/1992 | DeMond et al. ............. 340/707 |
| 4,924,413 A | 5/1990 | Suwannukul ............... 364/521 | 5,129,716 A | 7/1992 | Holakovszky et al. ........ 351/50 |
| 4,926,241 A | 5/1990 | Carey ........................... 357/57 | 5,132,723 A | 7/1992 | Gelbart ......................... 355/40 |
| 4,930,043 A | 5/1990 | Wiegand .................... 361/283 | 5,132,812 A | 7/1992 | Takahashi et al. .............. 359/9 |
| 4,934,773 A | 6/1990 | Becker ........................ 350/6.6 | 5,136,695 A | 8/1992 | Goldshlag et al. ........... 395/275 |
| 4,940,309 A | 7/1990 | Baum ......................... 350/171 | 5,137,836 A | 8/1992 | Lam ............................. 437/8 |
| 4,943,815 A | 7/1990 | Aldrich et al. .............. 346/108 | 5,142,303 A | 8/1992 | Nelson ....................... 346/108 |
| 4,945,773 A | 8/1990 | Sickafus .................... 73/862.59 | 5,142,405 A | 8/1992 | Hornbeck .................... 359/226 |
| 4,949,148 A | 8/1990 | Bartelink ..................... 357/74 | 5,142,677 A | 8/1992 | Ehlig et al. .................. 395/650 |
| 4,950,890 A | 8/1990 | Gelbart .................... 250/237 G | 5,144,472 A | 9/1992 | Sang, Jr. et al. ............ 359/254 |
| 4,952,925 A | 8/1990 | Haastert ...................... 340/784 | 5,147,815 A | 9/1992 | Casto .......................... 437/51 |
| 4,954,789 A | 9/1990 | Sampsell ..................... 330/4.3 | 5,148,157 A | 9/1992 | Florence ..................... 340/783 |
| 4,956,619 A | 9/1990 | Hornbeck ................... 330/4.3 | 5,148,506 A | 9/1992 | McDonald .................... 385/16 |
| 4,961,633 A | 10/1990 | Ibrahim et al. .............. 350/392 | 5,149,405 A | 9/1992 | Bruns et al. ............... 204/129.1 |
| 4,970,575 A | 11/1990 | Soga et al. .................... 358/60 | 5,150,205 A | 9/1992 | Um et al. ...................... 358/60 |
| 4,978,202 A | 12/1990 | Yang ..................... 350/331 R | 5,151,718 A | 9/1992 | Nelson ....................... 346/160 |
| 4,982,184 A | 1/1991 | Kirkwood ................... 340/783 | 5,151,724 A | 9/1992 | Kikinis ........................ 357/17 |
| 4,982,265 A | 1/1991 | Watanabe et al. ............. 357/75 | 5,151,763 A | 9/1992 | Marek et al. ................. 357/26 |
| 4,984,824 A | 1/1991 | Antes et al. ................... 283/91 | 5,153,770 A | 10/1992 | Harris ......................... 359/245 |
| 4,999,308 A | 3/1991 | Nishiura et al. ............... 437/4 | 5,155,604 A | 10/1992 | Miekka et al. ................ 359/2 |
| 5,003,300 A | 3/1991 | Wells ......................... 340/705 | 5,155,615 A | 10/1992 | Tagawa ...................... 359/213 |
| 5,009,473 A | 4/1991 | Hunter et al. ................ 350/6.6 | 5,155,778 A | 10/1992 | Magel et al. .................. 385/18 |
| 5,013,141 A | 5/1991 | Sakata ....................... 350/348 | 5,155,812 A | 10/1992 | Ehlig et al. .................. 395/275 |
| 5,018,256 A | 5/1991 | Hornbeck .................. 29/25.01 | 5,157,304 A | 10/1992 | Kane et al. ................... 313/495 |
| 5,022,750 A | 6/1991 | Flasck ......................... 353/31 | 5,159,485 A | 10/1992 | Nelson ....................... 359/291 |
| 5,023,905 A | 6/1991 | Wells et al. ................... 379/96 | 5,161,042 A | 11/1992 | Hamada ....................... 359/41 |
| 5,024,494 A | 6/1991 | Williams et al. ............. 350/3.6 | 5,162,787 A | 11/1992 | Thompson et al. .......... 340/794 |
| 5,028,939 A | 7/1991 | Hornbeck et al. ........... 346/160 | 5,164,019 A | 11/1992 | Sinton ........................ 136/249 |

| | | | | | |
|---|---|---|---|---|---|
| 5,165,013 A | 11/1992 | Faris ............................ 395/104 | 5,262,000 A | 11/1993 | Welbourn et al. ............ 156/643 |
| 5,168,401 A | 12/1992 | Endriz ........................ 359/625 | 5,272,473 A | 12/1993 | Thompson et al. ............. 345/7 |
| 5,168,406 A | 12/1992 | Nelson ........................ 359/855 | 5,278,652 A | 1/1994 | Urbanus et al. ............. 358/160 |
| 5,170,156 A | 12/1992 | DeMond et al. ............ 340/794 | 5,278,925 A | 1/1994 | Boysel et al. .................. 385/14 |
| 5,170,269 A | 12/1992 | Lin et al. ........................ 359/9 | 5,280,277 A | 1/1994 | Hornbeck ................... 345/108 |
| 5,170,283 A | 12/1992 | O'Brien et al. .............. 359/291 | 5,281,887 A | 1/1994 | Engle ......................... 310/335 |
| 5,172,161 A | 12/1992 | Nelson ........................ 355/200 | 5,281,957 A | 1/1994 | Schoolman ..................... 345/8 |
| 5,172,262 A | 12/1992 | Hornbeck .................... 359/223 | 5,285,105 A | 2/1994 | Cain ........................... 257/672 |
| 5,177,724 A | 1/1993 | Gelbart .................... 369/44.16 | 5,285,196 A | 2/1994 | Gale, Jr. ...................... 345/108 |
| 5,178,728 A | 1/1993 | Boysel et al. ................ 156/656 | 5,285,407 A | 2/1994 | Gale et al. ............. 365/189.11 |
| 5,179,274 A | 1/1993 | Sampsell ................. 250/208.2 | 5,287,096 A | 2/1994 | Thompson et al. ......... 345/147 |
| 5,179,367 A | 1/1993 | Shimizu ..................... 340/700 | 5,287,215 A | 2/1994 | Warde et al. ................ 359/293 |
| 5,181,231 A | 1/1993 | Parikh et al. .................. 377/26 | 5,289,172 A | 2/1994 | Gale, Jr. et al. ............. 345/108 |
| 5,182,665 A | 1/1993 | O'Callaghan et al. ......... 359/95 | 5,291,317 A | 3/1994 | Newswanger ................. 359/15 |
| 5,185,660 A | 2/1993 | Um .............................. 358/60 | 5,291,473 A | 3/1994 | Pauli .......................... 369/112 |
| 5,185,823 A | 2/1993 | Kaku et al. | 5,293,511 A | 3/1994 | Poradish et al. ............. 257/434 |
| 5,188,280 A | 2/1993 | Nakao et al. .................. 228/123 | 5,296,408 A | 3/1994 | Wilbarg et al. .............. 437/203 |
| 5,189,404 A | 2/1993 | Masimo et al. .............. 340/720 | 5,296,891 A | 3/1994 | Vogt et al. .................... 355/67 |
| 5,189,505 A | 2/1993 | Bartelink .................... 257/419 | 5,296,950 A | 3/1994 | Lin et al. ........................ 359/9 |
| 5,191,405 A | 3/1993 | Tomita et al. ............... 257/777 | 5,298,460 A | 3/1994 | Nishiguchi et al. .......... 437/183 |
| 5,192,864 A | 3/1993 | McEwen et al. ............. 250/234 | 5,299,037 A | 3/1994 | Sakata ......................... 359/41 |
| 5,192,946 A | 3/1993 | Thompson et al. ......... 340/794 | 5,299,289 A | 3/1994 | Omae et al. ................... 359/95 |
| 5,198,895 A | 3/1993 | Vick ........................... 358/103 | 5,300,813 A | 4/1994 | Joshi et al. .................. 257/752 |
| D334,557 S | 4/1993 | Hunter et al. ............... D14/114 | 5,301,062 A | 4/1994 | Takahashi et al. .......... 359/567 |
| D334,742 S | 4/1993 | Hunter et al. ............... D14/113 | 5,303,043 A | 4/1994 | Glenn .......................... 348/40 |
| 5,202,785 A | 4/1993 | Nelson ........................ 359/214 | 5,303,055 A | 4/1994 | Hendrix et al. ............. 348/761 |
| 5,206,629 A | 4/1993 | DeMond et al. ............ 340/719 | 5,307,056 A | 4/1994 | Urbanus ...................... 340/189 |
| 5,206,829 A | 4/1993 | Thakoor et al. | 5,307,185 A | 4/1994 | Jones et al. ................... 359/41 |
| 5,208,818 A | 5/1993 | Gelbart et al. ................. 372/30 | 5,310,624 A | 5/1994 | Ehrlich ....................... 430/322 |
| 5,208,891 A | 5/1993 | Prysner ....................... 385/116 | 5,311,349 A | 5/1994 | Anderson et al. ........... 359/223 |
| 5,210,637 A | 5/1993 | Puzey .......................... 359/263 | 5,311,360 A | 5/1994 | Bloom et al. ............... 359/572 |
| 5,212,115 A | 5/1993 | Cho et al. .................... 437/208 | 5,312,513 A | 5/1994 | Florence et al. ............. 156/643 |
| 5,212,555 A | 5/1993 | Stoltz .......................... 358/206 | 5,313,479 A | 5/1994 | Florence ...................... 372/26 |
| 5,212,582 A | 5/1993 | Nelson ........................ 359/224 | 5,313,648 A | 5/1994 | Ehlig et al. .................. 395/800 |
| 5,214,308 A | 5/1993 | Nishiguchi et al. .......... 257/692 | 5,313,835 A | 5/1994 | Dunn ........................... 73/505 |
| 5,214,419 A | 5/1993 | DeMond et al. ............ 340/794 | 5,315,418 A | 5/1994 | Sprague et al. ................ 359/41 |
| 5,214,420 A | 5/1993 | Thompson et al. ......... 340/795 | 5,315,423 A | 5/1994 | Hong .......................... 359/124 |
| 5,216,537 A | 6/1993 | Hornbeck .................... 359/291 | 5,315,429 A | 5/1994 | Abramov |
| 5,216,544 A | 6/1993 | Horikawa et al. ........... 359/622 | 5,319,214 A | 6/1994 | Gregory et al. .......... 250/504 R |
| 5,219,794 A | 6/1993 | Satoh et al. ................. 437/209 | 5,319,789 A | 6/1994 | Ehlig et al. .................. 395/800 |
| 5,220,200 A | 6/1993 | Blanton ....................... 257/778 | 5,319,792 A | 6/1994 | Ehlig et al. .................. 395/800 |
| 5,221,400 A | 6/1993 | Staller et al. ................ 156/292 | 5,321,416 A | 6/1994 | Bassett et al. ................. 345/8 |
| 5,221,982 A | 6/1993 | Faris ............................ 359/93 | 5,323,002 A | 6/1994 | Sampsell et al. ......... 250/252.1 |
| 5,224,088 A | 6/1993 | Atiya ........................... 369/97 | 5,323,051 A | 6/1994 | Adams et al. ............... 257/417 |
| D337,320 S | 7/1993 | Hunter et al. ............... D14/113 | 5,325,116 A | 6/1994 | Sampsell ..................... 346/108 |
| 5,226,099 A | 7/1993 | Mignardi et al. .............. 385/19 | 5,327,286 A | 7/1994 | Sampsell et al. ............ 359/561 |
| 5,229,597 A | 7/1993 | Fukatsu | 5,329,289 A | 7/1994 | Sakamoto et al. .......... 345/126 |
| 5,230,005 A | 7/1993 | Rubino et al. ................. 372/20 | 5,330,301 A | 7/1994 | Brancher ..................... 414/417 |
| 5,231,363 A | 7/1993 | Sano et al. .................. 332/109 | 5,330,878 A | 7/1994 | Nelson ........................ 430/311 |
| 5,231,388 A | 7/1993 | Stoltz .......................... 340/783 | 5,331,454 A | 7/1994 | Hornbeck .................... 359/224 |
| 5,231,432 A | 7/1993 | Glenn ........................... 353/31 | 5,334,991 A | 8/1994 | Wells et al. .................... 345/8 |
| 5,233,456 A | 8/1993 | Nelson ........................ 359/214 | 5,339,116 A | 8/1994 | Urbanus et al. ............. 348/716 |
| 5,233,460 A | 8/1993 | Partlo et al. ................. 359/247 | 5,339,177 A | 8/1994 | Jenkins et al. ................. 359/35 |
| 5,233,874 A | 8/1993 | Putty et al. ............. 73/517 AV | 5,340,772 A | 8/1994 | Rosotker ..................... 437/226 |
| 5,237,340 A | 8/1993 | Nelson ........................ 346/108 | 5,345,521 A | 9/1994 | McDonald et al. ............ 385/19 |
| 5,237,435 A | 8/1993 | Kurematsu et al. ........... 359/41 | 5,347,321 A | 9/1994 | Gove ........................... 348/663 |
| 5,239,448 A | 8/1993 | Perkins et al. ............... 361/764 | 5,347,378 A | 9/1994 | Handschy et al. ............. 359/53 |
| 5,239,806 A | 8/1993 | Maslakow .................... 53/432 | 5,347,433 A | 9/1994 | Sedlmayr .................... 362/32 |
| 5,240,818 A | 8/1993 | Mignardi et al. ............ 430/321 | 5,348,619 A | 9/1994 | Bohannon et al. ........... 156/664 |
| 5,245,686 A | 9/1993 | Faris et al. .................. 385/120 | 5,349,687 A | 9/1994 | Ehlig et al. .................. 395/800 |
| 5,247,180 A | 9/1993 | Mitcham et al. ......... 250/492.1 | 5,351,052 A | 9/1994 | D'Hont et al. ................ 342/42 |
| 5,247,593 A | 9/1993 | Lin et al. ..................... 385/17 | 5,352,926 A | 10/1994 | Andrews ..................... 257/717 |
| 5,249,245 A | 9/1993 | Lebby et al. .................. 385/89 | 5,354,416 A | 10/1994 | Okudaira et al. ............ 146/643 |
| 5,251,057 A | 10/1993 | Guerin et al. ................ 359/249 | 5,357,369 A | 10/1994 | Pilling et al. ................ 359/462 |
| 5,251,058 A | 10/1993 | MacArthur .................. 359/249 | 5,357,803 A | 10/1994 | Lane ...................... 73/517 B |
| 5,254,980 A | 10/1993 | Hendrix et al. ............... 345/84 | 5,359,349 A | 10/1994 | Jambor et al. ............... 345/168 |
| 5,255,100 A | 10/1993 | Urbanus ...................... 358/231 | 5,359,451 A | 10/1994 | Gelbart et al. ............... 359/285 |
| 5,256,869 A | 10/1993 | Lin et al. .................. 250/201.9 | 5,361,131 A | 11/1994 | Tekemori et al. ............ 356/355 |
| 5,258,325 A | 11/1993 | Spitzer et al. ................. 437/86 | 5,363,220 A | 11/1994 | Kuwayama et al. ........... 359/3 |
| 5,260,718 A | 11/1993 | Rommelmann et al. 346/107 R | 5,365,283 A | 11/1994 | Doherty et al. ............. 348/743 |
| 5,260,798 A | 11/1993 | Um et al. ..................... 358/233 | 5,367,585 A | 11/1994 | Ghezzo et al. ................ 385/23 |

| Patent | Date | Inventor | Class |
|---|---|---|---|
| 5,371,543 A | 12/1994 | Anderson | 348/270 |
| 5,371,618 A | 12/1994 | Tai et al. | 359/53 |
| 5,382,961 A | 1/1995 | Gale, Jr. | 345/108 |
| 5,387,924 A | 2/1995 | Gale, Jr. et al. | 345/108 |
| 5,389,182 A | 2/1995 | Mignardi | 156/344 |
| 5,391,881 A | 2/1995 | Jeuch et al. | 250/370.09 |
| 5,392,140 A | 2/1995 | Ezra et al. | 359/41 |
| 5,392,151 A | 2/1995 | Nelson | 359/223 |
| 5,394,303 A | 2/1995 | Yamaji | 361/749 |
| 5,398,071 A | 3/1995 | Gove et al. | 348/558 |
| 5,399,898 A | 3/1995 | Rostoker | 257/499 |
| 5,404,365 A | 4/1995 | Hiiro | 372/27 |
| 5,404,485 A | 4/1995 | Ban | 395/425 |
| 5,408,123 A | 4/1995 | Murai | 257/531 |
| 5,410,315 A | 4/1995 | Huber | 342/42 |
| 5,411,769 A | 5/1995 | Hornbeck | 427/534 |
| 5,412,186 A | 5/1995 | Gale | 219/679 |
| 5,412,501 A | 5/1995 | Fisli | 359/286 |
| 5,418,584 A | 5/1995 | Larson | 353/122 |
| 5,420,655 A | 5/1995 | Shimizu | 353/33 |
| 5,420,722 A | 5/1995 | Bielak | 359/708 |
| 5,426,072 A | 6/1995 | Finnila | 437/208 |
| 5,427,975 A | 6/1995 | Sparks et al. | 437/79 |
| 5,430,524 A | 7/1995 | Nelson | 355/200 |
| 5,435,876 A | 7/1995 | Alfaro et al. | 156/247 |
| 5,438,477 A | 8/1995 | Pasch | 361/689 |
| 5,439,731 A | 8/1995 | Li et al. | 428/209 |
| 5,442,411 A | 8/1995 | Urbanus et al. | 348/771 |
| 5,444,566 A | 8/1995 | Gale et al. | 359/291 |
| 5,445,559 A | 8/1995 | Gale et al. | 451/388 |
| 5,446,479 A | 8/1995 | Thompson et al. | 345/139 |
| 5,447,600 A | 9/1995 | Webb | 216/2 |
| 5,448,314 A | 9/1995 | Heimbuch et al. | 348/743 |
| 5,448,546 A | 9/1995 | Pauli | 369/112 |
| 5,450,088 A | 9/1995 | Meier et al. | 342/51 |
| 5,450,219 A | 9/1995 | Gold et al. | 359/40 |
| 5,451,103 A | 9/1995 | Hatanaka et al. | 353/31 |
| 5,452,024 A | 9/1995 | Sampsell | 348/755 |
| 5,452,138 A | 9/1995 | Mignardi et al. | 359/855 |
| 5,453,747 A | 9/1995 | D'Hont et al. | 342/42 |
| 5,453,778 A | 9/1995 | Venkateswar et al. | 347/239 |
| 5,453,803 A | 9/1995 | Shapiro et al. | 353/119 |
| 5,454,160 A | 10/1995 | Nickel | 29/840 |
| 5,454,906 A | 10/1995 | Baker et al. | 216/66 |
| 5,455,445 A | 10/1995 | Kurtz et al. | 257/419 |
| 5,455,455 A | 10/1995 | Badehi | 257/690 |
| 5,455,602 A | 10/1995 | Tew | 347/239 |
| 5,457,493 A | 10/1995 | Leddy et al. | 348/164 |
| 5,457,566 A | 10/1995 | Sampsell et al. | 359/292 |
| 5,457,567 A | 10/1995 | Shinohara | 359/305 |
| 5,458,716 A | 10/1995 | Alfaro et al. | 156/245 |
| 5,459,492 A | 10/1995 | Venkateswar | 347/253 |
| 5,459,528 A | 10/1995 | Pettitt | 348/568 |
| 5,459,592 A | 10/1995 | Shibatani et al. | 359/40 |
| 5,459,610 A | 10/1995 | Bloom et al. | 359/572 |
| 5,461,197 A | 10/1995 | Hiruta et al. | 174/52.4 |
| 5,461,410 A | 10/1995 | Venkateswar et al. | 347/240 |
| 5,461,411 A | 10/1995 | Florence et al. | 347/243 |
| 5,461,547 A | 10/1995 | Ciupke et al. | 362/31 |
| 5,463,347 A | 10/1995 | Jones et al. | 330/253 |
| 5,463,497 A | 10/1995 | Muraki et al. | 359/618 |
| 5,465,175 A | 11/1995 | Woodgate et al. | 359/463 |
| 5,467,106 A | 11/1995 | Salomon | 345/87 |
| 5,467,138 A | 11/1995 | Gove | 348/452 |
| 5,467,146 A | 11/1995 | Huang et al. | 348/743 |
| 5,469,302 A | 11/1995 | Lim | 359/846 |
| 5,471,341 A | 11/1995 | Warde et al. | 359/293 |
| 5,473,512 A | 12/1995 | Degani et al. | 361/760 |
| 5,475,236 A | 12/1995 | Yoshizaki | 257/48 |
| 5,480,839 A | 1/1996 | Ezawa et al. | 437/209 |
| 5,481,118 A | 1/1996 | Tew | 250/551 |
| 5,481,133 A | 1/1996 | Hsu | 257/621 |
| 5,482,564 A | 1/1996 | Douglas et al. | 134/18 |
| 5,482,818 A | 1/1996 | Nelson | 430/394 |
| 5,483,307 A | 1/1996 | Anderson | 353/98 |
| 5,485,172 A | 1/1996 | Sawachika et al. | 345/8 |
| 5,485,304 A | 1/1996 | Kaeriyama | 359/291 |
| 5,485,354 A | 1/1996 | Ciupke et al. | 362/31 |
| 5,486,698 A | 1/1996 | Hanson et al. | 250/332 |
| 5,486,841 A | 1/1996 | Hara et al. | 345/8 |
| 5,486,946 A | 1/1996 | Jachimowicz et al. | 359/263 |
| 5,488,431 A | 1/1996 | Gove et al. | 348/771 |
| 5,489,952 A | 2/1996 | Gove et al. | 348/771 |
| 5,490,009 A | 2/1996 | Venkateswar et al. | 359/291 |
| 5,491,510 A | 2/1996 | Gove | 348/77 |
| 5,491,612 A | 2/1996 | Nicewarner, Jr. | 361/760 |
| 5,491,715 A | 2/1996 | Flaxl | 375/344 |
| 5,493,177 A | 2/1996 | Muller et al. | 313/578 |
| 5,493,439 A | 2/1996 | Engle | 359/292 |
| 5,497,172 A | 3/1996 | Doherty et al. | 345/85 |
| 5,497,197 A | 3/1996 | Gove et al. | 348/388 |
| 5,497,262 A | 3/1996 | Kaeriyama | 359/223 |
| 5,499,060 A | 3/1996 | Gove et al. | 348/651 |
| 5,499,062 A | 3/1996 | Urbanus | 348/771 |
| 5,500,761 A | 3/1996 | Goossen et al. | 359/290 |
| 5,502,481 A | 3/1996 | Dentinger et al. | 348/51 |
| 5,504,504 A | 4/1996 | Markandey et al. | 345/214 |
| 5,504,514 A | 4/1996 | Nelson | 347/130 |
| 5,504,575 A | 4/1996 | Stafford | 356/330 |
| 5,504,614 A | 4/1996 | Webb et al. | 359/223 |
| 5,506,171 A | 4/1996 | Leonard et al. | 437/187 |
| 5,506,597 A | 4/1996 | Thompson et al. | 345/82 |
| 5,506,720 A | 4/1996 | Yoon | 359/224 |
| 5,508,558 A | 4/1996 | Robinette, Jr. et al. | 257/700 |
| 5,508,561 A | 4/1996 | Tago et al. | 257/737 |
| 5,508,565 A | 4/1996 | Hatakeyama et al. | 257/777 |
| 5,508,750 A | 4/1996 | Hewlett et al. | 348/558 |
| 5,508,840 A | 4/1996 | Vogel et al. | 359/291 |
| 5,508,841 A | 4/1996 | Lin et al. | 359/318 |
| 5,510,758 A | 4/1996 | Fujita et al. | 333/247 |
| 5,510,824 A | 4/1996 | Nelson | 347/239 |
| 5,512,374 A | 4/1996 | Wallace et al. | 428/422 |
| 5,512,748 A | 4/1996 | Hanson | 250/332 |
| 5,515,076 A | 5/1996 | Thompson et al. | 345/139 |
| 5,516,125 A | 5/1996 | McKenna | 279/3 |
| 5,517,340 A | 5/1996 | Doany et al. | 359/41 |
| 5,517,347 A | 5/1996 | Sampsell | 359/224 |
| 5,517,357 A | 5/1996 | Shibayama | 359/547 |
| 5,517,359 A | 5/1996 | Gelbart | 359/623 |
| 5,519,251 A | 5/1996 | Sato et al. | 257/666 |
| 5,519,450 A | 5/1996 | Urbanus et al. | 348/600 |
| 5,521,748 A | 5/1996 | Sarraf | 359/321 |
| 5,523,619 A | 6/1996 | McAllister et al. | 257/686 |
| 5,523,628 A | 6/1996 | Williams et al. | 257/777 |
| 5,523,803 A | 6/1996 | Urbanus et al. | 348/771 |
| 5,523,878 A | 6/1996 | Wallace et al. | 359/290 |
| 5,523,881 A | 6/1996 | Florence et al. | 359/561 |
| 5,523,920 A | 6/1996 | Machuga et al. | 361/767 |
| 5,524,155 A | 6/1996 | Weaver | 385/24 |
| 5,534,107 A | 7/1996 | Gray et al. | 156/643.1 |
| 5,534,883 A | 7/1996 | Koh | 345/3 |
| 5,539,422 A | 7/1996 | Heacock et al. | 345/8 |
| 5,544,306 A | 8/1996 | Deering et al. | 395/164 |
| 5,554,304 A | 9/1996 | Suzuki | 216/2 |
| 5,576,878 A | 11/1996 | Henck | 359/224 |
| 5,602,671 A | 2/1997 | Hornbeck | 359/224 |
| 5,606,181 A | 2/1997 | Sakuma et al. | 257/88 |
| 5,606,447 A | 2/1997 | Asada et al. | 359/199 |
| 5,610,438 A | 3/1997 | Wallace et al. | 257/682 |
| 5,623,361 A | 4/1997 | Engle | 359/291 |
| 5,629,566 A | 5/1997 | Doi et al. | 257/789 |
| 5,629,801 A | 5/1997 | Staker et al. | 359/572 |

| | | | | | | |
|---|---|---|---|---|---|---|
| 5,640,216 A | 6/1997 | Hasegawa et al. ............. 349/58 | | 5,986,796 A | 11/1999 | Miles .......... 359/260 |
| 5,658,698 A | 8/1997 | Yagi et al. ................... 430/11 | | 5,995,303 A | 11/1999 | Honguh et al. ............. 359/708 |
| 5,661,592 A | 8/1997 | Bornstein et al. ........... 359/291 | | 5,999,319 A | 12/1999 | Castracane ................... 359/573 |
| 5,661,593 A | 8/1997 | Engle ........................ 359/292 | | 6,004,912 A | 12/1999 | Gudeman .................... 508/577 |
| 5,663,817 A | 9/1997 | Frapin et al. .................. 349/5 | | 6,016,222 A | 1/2000 | Setani et al. ................. 359/571 |
| 5,668,611 A | 9/1997 | Ernstoff et al. ............. 348/771 | | 6,025,859 A | 2/2000 | Ide et al. ..................... 347/135 |
| 5,673,139 A | 9/1997 | Johnson ..................... 359/291 | | 6,038,057 A | 3/2000 | Brazas, Jr. et al. ......... 359/291 |
| 5,677,783 A | 10/1997 | Bloom et al. .............. 359/224 | | 6,040,748 A | 3/2000 | Gueissaz .................... 335/78 |
| 5,689,361 A | 11/1997 | Damen et al. .............. 359/284 | | 6,046,840 A | 4/2000 | Huibers ...................... 359/291 |
| 5,691,836 A | 11/1997 | Clark ......................... 359/247 | | 6,055,090 A | 4/2000 | Miles .......................... 359/291 |
| 5,694,740 A | 12/1997 | Martin et al. ................. 53/431 | | 6,057,520 A | 5/2000 | Goodwin-Johansson .... 200/181 |
| 5,696,560 A | 12/1997 | Songer ....................... 348/436 | | 6,061,166 A | 5/2000 | Furlani et al. .............. 359/254 |
| 5,699,740 A | 12/1997 | Gelbart ....................... 101/477 | | 6,061,489 A | 5/2000 | Ezra et al. .................... 385/115 |
| 5,704,700 A | 1/1998 | Kappel et al. ................ 353/31 | | 6,062,461 A | 5/2000 | Sparks et al. ............. 228/123.1 |
| 5,707,160 A | 1/1998 | Bowen ....................... 400/472 | | 6,064,404 A | 5/2000 | Aras et al. ................... 345/507 |
| 5,712,649 A | 1/1998 | Tosaki ........................... 345/8 | | 6,069,392 A | 5/2000 | Tai et al. ..................... 257/419 |
| 5,713,652 A | 2/1998 | Zavracky et al. ............ 353/122 | | 6,071,652 A | 6/2000 | Feldman et al. ............... 430/5 |
| 5,726,480 A | 3/1998 | Pister .......................... 257/415 | | 6,075,632 A | 6/2000 | Braun ......................... 359/124 |
| 5,731,802 A | 3/1998 | Aras et al. ................... 345/148 | | 6,084,626 A | 7/2000 | Ramanujan et al. ......... 347/239 |
| 5,734,224 A | 3/1998 | Tagawa et al. .............. 313/493 | | 6,088,102 A | 7/2000 | Manhart ...................... 356/354 |
| 5,742,373 A | 4/1998 | Alvelda ....................... 349/204 | | 6,090,717 A | 7/2000 | Powell et al. ............... 438/710 |
| 5,744,752 A | 4/1998 | McHerron et al. ......... 174/52.4 | | 6,091,521 A | 7/2000 | Popovich ..................... 359/15 |
| 5,745,271 A | 4/1998 | Ford et al. ................... 359/130 | | 6,096,576 A | 8/2000 | Corbin et al. ............... 438/108 |
| 5,757,354 A | 5/1998 | Kawamura ................... 345/126 | | 6,097,352 A | 8/2000 | Zavracky et al. .............. 345/7 |
| 5,757,536 A | 5/1998 | Ricco et al. ................. 359/224 | | 6,101,036 A | 8/2000 | Bloom ........................ 359/567 |
| 5,764,280 A | 6/1998 | Bloom et al. ................. 348/53 | | 6,115,168 A | 9/2000 | Zhao et al. .................. 359/247 |
| 5,768,009 A | 6/1998 | Little ........................... 359/293 | | 6,122,299 A | 9/2000 | DeMars et al. ............... 372/20 |
| 5,770,473 A | 6/1998 | Hall et al. .................... 438/26 | | 6,123,985 A | 9/2000 | Robinson et al. ........... 427/162 |
| 5,793,519 A | 8/1998 | Furlani et al. ............... 359/291 | | 6,124,145 A | 9/2000 | Stemme et al. ............... 438/26 |
| 5,798,743 A | 8/1998 | Bloom .......................... 345/90 | | 6,130,770 A | 10/2000 | Bloom ........................ 359/224 |
| 5,798,805 A | 8/1998 | Ooi et al. .................... 349/10 | | 6,144,481 A | 11/2000 | Kowarz et al. ............. 359/291 |
| 5,801,074 A | 9/1998 | Kim et al. ................... 438/125 | | 6,147,789 A | 11/2000 | Gelbart ....................... 359/231 |
| 5,802,222 A | 9/1998 | Rasch et al. ................... 385/1 | | 6,154,259 A | 11/2000 | Hargis et al. ............... 348/756 |
| 5,808,323 A | 9/1998 | Spaeth et al. ................. 257/88 | | 6,154,305 A | 11/2000 | Dickensheets et al. |
| 5,808,797 A | 9/1998 | Bloom et al. ............... 359/572 | | 6,163,026 A | 12/2000 | Bawolek et al. ............ 250/351 |
| 5,815,126 A | 9/1998 | Fan et al. ...................... 345/8 | | 6,163,402 A | 12/2000 | Chou et al. ................. 359/443 |
| 5,825,443 A | 10/1998 | Kawasaki et al. ............ 349/95 | | 6,169,624 B1 | 1/2001 | Godil et al. ................. 359/237 |
| 5,835,255 A | 11/1998 | Miles ......................... 359/291 | | 6,172,796 B1 | 1/2001 | Kowarz et al. ............. 359/290 |
| 5,835,256 A | 11/1998 | Huibers ...................... 359/291 | | 6,172,797 B1 | 1/2001 | Huibers ...................... 359/291 |
| 5,837,562 A | 11/1998 | Cho ............................ 438/51 | | 6,177,980 B1 | 1/2001 | Johnson ........................ 355/67 |
| 5,841,579 A | 11/1998 | Bloom et al. ............... 359/572 | | 6,181,458 B1 | 1/2001 | Brazas, Jr. et al. ......... 359/290 |
| 5,844,711 A | 12/1998 | Long, Jr. .................... 359/291 | | 6,188,519 B1 | 2/2001 | Johnson ...................... 359/572 |
| 5,847,859 A | 12/1998 | Murata ........................ 359/201 | | 6,195,196 B1 | 2/2001 | Kimura et al. .............. 359/295 |
| 5,862,164 A | 1/1999 | Hill .............................. 372/27 | | 6,197,610 B1 | 3/2001 | Toda ........................... 438/50 |
| 5,868,854 A | 2/1999 | Kojima et al. ................. 134/1.3 | | 6,210,988 B1 | 4/2001 | Howe et al. ................. 438/50 |
| 5,886,675 A | 3/1999 | Aye et al. ....................... 345/7 | | 6,215,579 B1 | 4/2001 | Bloom et al. ............... 359/298 |
| 5,892,505 A | 4/1999 | Tropper ...................... 345/208 | | 6,219,015 B1 | 4/2001 | Bloom et al. ................. 345/87 |
| 5,895,233 A | 4/1999 | Higashi et al. .............. 438/107 | | 6,222,954 B1 | 4/2001 | Riza ............................. 385/18 |
| 5,898,515 A | 4/1999 | Furlani et al. ............... 359/290 | | 6,229,650 B1 | 5/2001 | Reznichenko et al. ...... 359/566 |
| 5,903,243 A | 5/1999 | Jones ............................ 345/7 | | 6,229,683 B1 | 5/2001 | Goodwin-Johansson .... 361/233 |
| 5,903,395 A | 5/1999 | Rallison et al. ............. 359/630 | | 6,241,143 B1 | 6/2001 | Kuroda ..................... 228/110.1 |
| 5,910,856 A | 6/1999 | Ghosh et al. ................ 359/291 | | 6,249,381 B1 | 6/2001 | Suganuma |
| 5,912,094 A | 6/1999 | Aksyuk et al. ................. 430/5 | | 6,251,842 B1 | 6/2001 | Gudeman .................... 508/577 |
| 5,912,608 A | 6/1999 | Asada ......................... 335/222 | | 6,252,697 B1 | 6/2001 | Hawkins et al. ............ 359/290 |
| 5,914,801 A | 6/1999 | Dhuler et al. ............... 359/230 | | 6,254,792 B1 | 7/2001 | Van Buskirk et al. ........ 216/13 |
| 5,915,168 A | 6/1999 | Salatino et al. ............. 438/110 | | 6,261,494 B1 | 7/2001 | Zavracky et al. ........... 264/104 |
| 5,919,548 A | 7/1999 | Barron et al. ............... 428/138 | | 6,268,952 B1 | 7/2001 | Godil et al. ................. 359/291 |
| 5,920,411 A | 7/1999 | Duck et al. .................. 359/212 | | 6,271,145 B1 | 8/2001 | Toda ........................... 438/706 |
| 5,920,418 A | 7/1999 | Shiono et al. ............... 359/246 | | 6,271,808 B1 | 8/2001 | Corbin ........................... 345/7 |
| 5,923,475 A | 7/1999 | Kurtz et al. ................. 359/619 | | 6,274,469 B1 | 8/2001 | Yu .............................. 438/592 |
| 5,926,309 A | 7/1999 | Little ........................... 359/293 | | 6,282,213 B1 | 8/2001 | Gutin et al. |
| 5,926,318 A | 7/1999 | Hebert ........................ 359/618 | | 6,290,859 B1 | 9/2001 | Fleming et al. ................ 216/2 |
| 5,942,791 A | 8/1999 | Shorrocks et al. ........... 257/522 | | 6,290,864 B1 | 9/2001 | Patel et al. .................... 216/79 |
| 5,949,390 A | 9/1999 | Nomura et al. ............... 345/32 | | 6,300,148 B1 | 10/2001 | Birdsley et al. ............... 438/15 |
| 5,949,570 A | 9/1999 | Shiono et al. ............... 359/291 | | 6,303,986 B1 | 10/2001 | Shook ......................... 257/680 |
| 5,953,161 A | 9/1999 | Troxell et al. ............... 359/618 | | 6,310,018 B1 | 10/2001 | Behr et al. ................... 510/175 |
| 5,955,771 A | 9/1999 | Kurtz et al. ................. 257/419 | | 6,313,901 B1 * | 11/2001 | Cacharelis |
| 5,963,788 A | 10/1999 | Barron et al. ................. 438/48 | | 6,323,984 B1 | 11/2001 | Trisnadi ...................... 359/245 |
| 5,978,127 A | 11/1999 | Berg ........................... 359/279 | | 6,342,960 B1 | 1/2002 | McCullough ............... 359/124 |
| 5,982,553 A | 11/1999 | Bloom et al. ............... 359/627 | | 6,346,430 B1 * | 2/2002 | Raj et al. |
| 5,986,634 A | 11/1999 | Alioshin et al. ............. 345/126 | | 6,356,577 B1 | 3/2002 | Miller ......................... 372/107 |

| | | | |
|---|---|---|---|
| 6,356,689 B1 | 3/2002 | Greywall | 385/52 |
| 6,359,333 B1 | 3/2002 | Wood et al. | 257/704 |
| 6,384,959 B1 | 5/2002 | Furlani et al. | 359/291 |
| 6,387,723 B1 | 5/2002 | Payne et al. | 438/48 |
| 6,392,309 B1 | 5/2002 | Wataya et al. | 257/796 |
| 6,396,789 B1 | 5/2002 | Guerra et al. | 369/112 |
| 6,418,152 B1 | 7/2002 | Davis | |
| 6,421,179 B1 | 7/2002 | Gutin et al. | 359/572 |
| 6,438,954 B1 | 8/2002 | Goetz et al. | |
| 6,445,502 B1 | 9/2002 | Islam et al. | 359/571 |
| 6,452,260 B1 | 9/2002 | Corbin et al. | 257/686 |
| 6,479,811 B1 | 11/2002 | Kruschwitz et al. | |
| 6,480,634 B1 | 11/2002 | Corrigan | 385/4 |
| 6,497,490 B1 | 12/2002 | Miller et al. | 359/614 |
| 6,525,863 B1 | 2/2003 | Riza | 359/290 |
| 6,569,717 B1 * | 5/2003 | Murade | |
| 2001/0019454 A1 | 9/2001 | Tadic-Galeb et al. | 359/649 |
| 2002/0015230 A1 | 2/2002 | Pilossof et al. | 359/558 |
| 2002/0021485 A1 | 2/2002 | Pilossof | 359/295 |
| 2002/0079432 A1 | 6/2002 | Lee et al. | 250/216 |
| 2002/0105725 A1 | 8/2002 | Sweatt et al. | 359/566 |
| 2002/0112746 A1 | 8/2002 | DeYoung et al. | 134/36 |
| 2002/0131230 A1 | 9/2002 | Potter | 361/277 |
| 2002/0135708 A1 * | 9/2002 | Murden et al | |
| 2002/0176151 A1 | 11/2002 | Moon et al. | |
| 2003/0056078 A1 | 3/2003 | Johansson et al. | |

FOREIGN PATENT DOCUMENTS

| | | | | |
|---|---|---|---|---|
| DE | 197 23 618 A1 | 12/1997 | | G03F/1/14 |
| DE | 197 51 716 A1 | 5/1998 | | G02B/27/14 |
| DE | 198 46 532 C1 | 5/2000 | | G02B/27/09 |
| EP | 0 089 044 A2 | 9/1983 | | H01L/23/10 |
| EP | 0 261 901 A2 | 3/1988 | | G09G/3/36 |
| EP | 0 314 437 A1 | 10/1988 | | H01L/25/08 |
| EP | 0 304 263 A2 | 2/1989 | | H01L/25/065 |
| EP | 0 306 308 A2 | 3/1989 | | H04N/3/14 |
| EP | 0 322 714 A2 | 7/1989 | | G02B/5/30 |
| EP | 0 627 644 A3 | 9/1990 | | G02B/27/00 |
| EP | 0 417 039 A1 | 3/1991 | | G03B/21/20 |
| EP | 0 423 513 A2 | 4/1991 | | H01S/3/085 |
| EP | 0 436 738 | 7/1991 | | H04N/5/74 |
| EP | 0 458 316 A2 | 11/1991 | | G06K/11/06 |
| EP | 0 477 566 A2 | 4/1992 | | G02B/26/08 |
| EP | 0 488 326 A3 | 6/1992 | | G09G/3/28 |
| EP | 0 499 566 A2 | 8/1992 | | G06F/3/033 |
| EP | 0 528 646 A1 | 2/1993 | | G09G/3/02 |
| EP | 0 530 760 A2 | 3/1993 | | G09G/3/34 |
| EP | 0 550 189 A1 | 7/1993 | | G02F/1/315 |
| EP | 0 610 665 A1 | 8/1994 | | G09G/3/34 |
| EP | 0 627 644 A2 | 12/1994 | | G02B/27/00 |
| EP | 0 627 850 A1 | 12/1994 | | H04N/5/64 |
| EP | 0 643 314 A2 | 3/1995 | | G02B/27/00 |
| EP | 0 654 777 A1 | 5/1995 | | G09G/3/34 |
| EP | 0 658 868 A1 | 6/1995 | | G09G/3/34 |
| EP | 0 658 830 A1 | 12/1995 | | G09G/3/34 |
| EP | 0 689 078 A1 | 12/1995 | | G02B/26/08 |
| EP | 0 801 319 A1 | 10/1997 | | G02B/26/00 |
| EP | 0 851 492 A2 | 7/1998 | | H01L/23/538 |
| EP | 1 003 071 | 5/2000 | | G03B/27/72 |
| EP | 1 014 143 A1 | 6/2000 | | G02B/26/08 |
| EP | 1 040 927 A2 | 10/2000 | | B41J/2/455 |
| GB | 2 117 564 A | 10/1983 | | H04L/25/08 |
| GB | 2 118 365 A | 10/1983 | | H01L/27/13 |
| GB | 2 266 385 A | 10/1993 | | G02B/23/10 |
| GB | 2 296 152 A | 6/1996 | | H04N/13/04 |
| GB | 2 319 424 A | 5/1998 | | H04N/13/04 |
| JP | 53-39068 | 4/1978 | | H01L/23/12 |
| JP | 55-111151 | 8/1980 | | H01L/27/00 |
| JP | 57-31166 | 2/1982 | | H01L/23/48 |
| JP | 57-210638 | 12/1982 | | H01L/21/60 |
| JP | 60-49638 | 3/1985 | | H01L/21/60 |
| JP | 60-94756 | 5/1985 | | H01L/25/04 |
| JP | 60-250639 | 12/1985 | | H01L/21/58 |
| JP | 61-142750 | 6/1986 | | H01L/21/60 |
| JP | 61-145838 | 7/1986 | | H01L/21/60 |
| JP | 63-234767 | 9/1988 | | H04N/1/04 |
| JP | 63-305323 | 12/1988 | | G02F/1/13 |
| JP | 1-155637 | 6/1989 | | H01L/21/66 |
| JP | 40-1155637 | 6/1989 | | H01L/21/92 |
| JP | 2219092 | 8/1990 | | G09G/3/28 |
| JP | 4-333015 | 11/1992 | | G02B/27/18 |
| JP | 7-281161 | 10/1995 | | G02F/1/1333 |
| JP | 3288369 | 3/2002 | | G02B/26/06 |
| WO | WO 90/13913 | 11/1990 | | H01L/23/10 |
| WO | WO 92/12506 | 7/1992 | | G09F/9/37 |
| WO | WO 93/02269 | 2/1993 | | E06B/5/10 |
| WO | WO 93/09472 | 5/1993 | | G03F/7/20 |
| WO | WO 93/18428 | 9/1993 | | G02B/27/00 |
| WO | WO 93/22694 | 11/1993 | | G02B/5/18 |
| WO | WO 94/09473 | 4/1994 | | G09G/3/34 |
| WO | WO 94/29761 | 12/1994 | | G02B/27/24 |
| WO | WO 95/11473 | 4/1995 | | G02B/27/00 |
| WO | WO 96/02941 | 2/1996 | | H01L/23/02 |
| WO | WO 96-08031 | 3/1996 | | H01J/29/12 |
| WO | WO 96/41217 | 12/1996 | | G02B/5/18 |
| WO | WO 96/41224 | 12/1996 | | G02B/19/00 |
| WO | WO 97/22033 | 6/1997 | | G02B/27/22 |
| WO | WO 97/26569 | 7/1997 | | G02B/5/18 |
| WO | WO 98/05935 | 2/1998 | | G01L/9/06 |
| WO | WO 98/24240 | 6/1998 | | H04N/9/31 |
| WO | WO 98/41893 | 9/1998 | | G02B/26/08 |
| WO | WO 99/07146 | 2/1999 | | H04N/7/16 |
| WO | WO 99/12208 | 3/1999 | | H01L/25/065 |
| WO | WO 99/23520 | 5/1999 | | G02B/26/08 |
| WO | WO 99/34484 | 7/1999 | | |
| WO | WO 99/59335 | 11/1999 | | H04N/5/765 |
| WO | WO 99/63388 | 12/1999 | | G02B/27/22 |
| WO | WO 99/67671 | 12/1999 | | G02B/26/08 |
| WO | WO 00/04718 | 1/2000 | | H04N/7/167 |
| WO | WO 00/07225 | 2/2000 | | H01L/21/00 |
| WO | WO 01/04674 A1 | 1/2001 | | G02B/6/12 |
| WO | WO 01/006297 A3 | 1/2001 | | G02B/27/10 |
| WO | WO 01/57581 A3 | 8/2001 | | G02B/27/48 |
| WO | WO 02/025348 | 3/2002 | | G02B/26/02 |
| WO | WO 02/31575 A2 | 4/2002 | | G02B/27/00 |
| WO | WO 02/058111 A2 | 7/2002 | | |
| WO | WO 02/065184 | 8/2002 | | G02B/27/12 |
| WO | WO 02/073286 A2 | 9/2002 | | G02B/26/08 |
| WO | WO 02/084375 | 10/2002 | | G02B/26/08 |
| WO | WO 02/084397 A3 | 10/2002 | | G02B/27/18 |
| WO | WO 03/001281 A1 | 1/2003 | | G02F/1/01 |
| WO | WO 03/001716 A1 | 1/2003 | | H04J/14/02 |
| WO | WO 03/012523 | 2/2003 | | G02B/26/00 |
| WO | WO 03/016965 A1 | 2/2003 | | G02B/5/18 |
| WO | WO 93/023849 A1 | 3/2003 | | H01L/23/02 |
| WO | WO 93/025628 A2 | 3/2003 | | |

OTHER PUBLICATIONS

Xuan–Qi Wang et al., "Gas–Phase Silicon Etching with Bromine Trifluoride," Depart. of Electrical Engineering, 136–93 California Institute of Technology, 1997 IEEE, pp. 1505–1508.

Harold F. Winters, "Etch products from the reaction of $XeF_2$ with $SiO_2$, $Si_3N_4$, SiC, and Si in the presence of Ion Bombardment," IBM Research Laboratory, 1983 American Vacuum Society, pp. 927–931.

F.A. Houle, "Dynamics of $SiF_4$ desorption during etching of silicon by $XeF_2$," J. Chem. Phys. 87 (3), Aug. 1, 1987, pp. 1866–1872.

Mehran Mehregany, "Microelectromechanical Systems," 1993 IEEE, pp. 14–22.

D. Moser et al. "A CMOS Compatible Thermally Excited Silicon Oxide Beam Resonator with Aluminium Mirror," Physical Electronics Laboratory, 1991 IEEE, pp. 547–550.

M. Parameswaran et al., "Commercial CMOS Fabricated Integrated Dynamic Thermal Scene Simulator," 1991 IEEE, pp. 29.4.1–29.4.4.

M. Parameswaran et al., "CMOS Electrothermal Microactuators," Depart. of Electrical Engineering, 1990 IEEE, pp. 128–131.

U. Streller et al., "Selectivity in dry etching of Si(100) with $XeF_2$ and VUV light," Applied Science 106, (1996), pp. 341–346.

M.J.M. Vugts et al., "Si/$XeF_2$ etching: Temperature dependence," 1996 American Vacuum Society, pp. 2766–2774.

P. Krummenacher et al., "Smart Temperature Sensor in CMOS Technology," Sensors and Actuators, A–21–A–23 (1990), pp. 636–638.

Henry Baltes, "CMOS as sensor technology," Sensors and Actuators A. 37–38, (1993), pp. 51–56.

Thomas Boltshauser et al., "Piezoresistive Membrane Hygrometers Based on IC Technology," Sensor and Materials, 5, 3, (1993), pp. 125–134.

Z. Parpia et al., "Modeling of CMOS Compatible High Voltage Device Structures," pp. 41–50.

Jon Gildemeister, "Xenon Difluoride Etching System," 1997, UC Berkeley MicroTabrication Manual Chapter 7.15, p. 2–5.

W. Riethmuller et al., "A smart accelerometer with on–chip electronics fabricated by a commercial CMOS process," Sensors and Actuators A. 31, (1992), 121–124.

W. Gopel et al., "Sensors—A Comprehensive Survey," vol. 7, Weinheim New York, 44 pgs.

D. E. Ibbotson et al., "Comparison of $XeF_2$ and F–atom reations with Si and $SiO_2$," 1984 American Institute of Physics, pp. 1129–1131.

D. E. Ibbotson et al., "Plasmaless dry etching of silicon with fluorine–containing compounds," 1984 American Institute of Physics, pp. 2939–2942.

M.H. Hecht et al., "A novel x–ray photoelectron spectroscopy study of the Al/$SiO_2$ interfaces," 1985 American Institute of Physics, pp. 5256–52616.

Daniel L. Flamm et al., "$XeF_2$ and F–Atom Reactions with Si: Their Significance for Plasma Etching,," Solid State Technology, V. 26, #4, 4/83, pp. 117–121.

H.F. Winters et al., "The etching of silicon with $XeF_2$ vapor," Appl. Phys. Lett. vol. 34, No. 1, Jan. 1979, pp. 70–73.

Wayne Bailey et al., "Microelectronic Structures and Microelectromechanical Devices for Optical Processing and Multimedia Applications," SPIE—The International Society for Optical Engineering, vol. 2641, Oct. 1995, 13 pgs.

"Realizing Suspended Structures on Chips Fabricated by CMOS Foundry Processes Through the MOSIS Service," National Inst. of Standards and Technology, Jun. 1994, 63 pgs.

David Moser et al., "CMOS Flow Sensors," 1993, 195 pgs.

Apte et al., "Deformable Grating Light Valves for High Resolution Displays," Solid State Actuator Workshop, Hilton Head, South Carolina, Jun. 13–16, 1994.

Sene et al., "Polysilicon micromechanical gratings for optical modulation," Sensors and Actuators, vol. A57, pp. 145–151, 1996.

Amm et al., "Invited Paper: Grating Light Valve™ Technology: Update and Novel Applications,"SID Digest, vol. 29, 1998.

R. Apte, "Grating Light Valves for High Resolution Displays", Solid State Sensors and Actuators Workshop, Ph D. Dissertation, Stanford University (Jun. 1994).

O. Solgaard, "Integrated Semiconductor Light Modulators for Fiber–Optic and Display Applications", Ph.D. Dissertation, Stanford University Feb., 1992.

J. Neff, "Two–Dimensional Spatial Light Modulators: A Tutorial", Proceedings of the IEEE, vol. 78, No. 5 (May 1990), pp. 826–855.

R. Gerhard–Multhaupt, "Viscoelastic Spatial Light Modulators and Schlieren–Optical Systems for HDTV Projection Displays" SPIE vol. 1255 Large Screen Projection Displays 11 (1990), pp. 69–78.

R. Gerhard–Multhaupt, "Light–Valve Technologies for High–Definition Television Projection Displays", Displays vol. 12, No. 3/4 (1991), pp. 115–128.

O. Solgaard, F. Sandejas, and D. Bloom, "Deformable Grating Optical Modulator," Optics Letters, vol. 17, No. 9, May 1, 1992, New York, USA, pp. 688–690.

F. Sandejas, R. Apte, W. Banyai, and D. Bloom, "Surface Microfabrication of Deformable Grating Valve for High Resolution Displays," The $7^{th}$ International Conference on Solid–State Sensors and Actuators.

P. Alvelda, "High–Efficiency Color Microdisplays," SID 95 Digest, pp. 307–311, 1995.

Worboys et al., "Miniature Display Technology for Integrated Helmut Systems," GEC Journal of Research, vol. 10, No. 2, pp. 111–118, Chelmsford, Essex, GB 1993.

M. Farn et al., "Color Separation by use of Binay Optics," Optics Letters, vol. 18:15 pp. 1214–1216, 1993.

P. Alvelda, "VLSI Microdisplays and Optoelectrics Technology,"MIT, pp. 1–93, 1995.

P. Alvelda, "VLSI Microdisplays Technology," Oct. 14, 1994.

D. Rowe, "Laser Beam Scanning," SPIE, vol. 2088, Oct. 5, 1993, 18–26.

L. Hornbeck, "Deformable–Mirror Spatial Light Modulators," Spatial Light Modulators and Applications III, Aug. 8, CA 1989, pp. 86–102.

Russick et al., "Supercritical Carbon Dioxide Extraction of Solvent from Micromachined Structures," Supercritical Fluids, Chapter 18, American Chemical Society, pp 255–269, 1997.

Buhler et al., "Linear Array of Complementary Metal Oxide Semiconductor Double–Pass Metal Micromirrors," Optical Engineering, vol. 36, No. 5, pp 1391–1398, May 1997.

Gani et al., "Variable Gratings for Optical Switching: Rigorous Electromagnetic Simulation and Design," Optical Engineering, vol. 38, No. 3, pp 552–557, Mar. 1999.

T. Iwai et al., "Real–time Profiling of a Pure Phase Object Using an Auto–Wigner Distribution Function," Optics Communications, vol. 95, Nos. 4–6, Jan. 15, 1993, p 199–204.

R. Tepe, et al. "Viscoelastic Spatial Light Modulator with Active Matrix Addressing," Applied Optics, vol. 28, No. 22, New York, USA, pp. 4826–4834, Nov. 15, 1989.

W. Brinker, et al. "Deformation Behavior of Thin Viscoelastic Layers Used in an Active–Matrix–Addressed Spatial Light Modulator," SPIE vol. 1018, pp. 19–85, Germany, 1988.

T. Utsunomiya and H. Sato, "Electrically Deformable Echellette Grating and its Application to Tunable Laser Resonator," Electronics and Communications in Japan, vol. 63–c, No. 10, pp. 94–100, Japan, 1980.

Burns, D.M. et al., *Development of microelectromechanical variable blaze gratings*, Sensors and Actuators A, pp. 7–15, 1998.

R.N. Thomas, et al., "The Mirror–Matrix Tube: A Novel Light Valve for Projection Displays", IEEE Transactions on Electron Devices, vol. ED–22, No. 9, pp. 765–775, Sep. 1975.

J. Guldberg, et al., "An Aluminum/SiO2/Silicon–on–Sapphire Light Valve Matrix for Projection Displays," Applied Physics Letters, vol. 26, No. 7, pp. 391–393, Apr. 1975.

"Kitchen Computer", IBM Technical Disclosure Bulletin, vol. 37, No. 12, pp. 223–225, Dec. 1994.

"Image Orientation Sensing and Correction for Notepads", Research Disclosure, No. 34788, p. 217, Mar. 1993.

Beck Mason et al. "Directly Modulated Sampled Grating DBR Lasers for Long–Haul WDM Communication Systems" IEEE Photonics Technology Letters, vol. 9, No. 3, Mar. 1997.pp. 377 of 379.

N. J. Frigo et al., "A Wavelength–Division Multiplexed Passive Optical Network with Cost–Shared Components", IEEE Photonics Technology Letters, vol. 6, No. 11, Nov. 1994, pp. 1365 of 1367.

M. S. Goodman et al., "The LAMBDANET Multiwavelength Network: Architecture, Applications, and Demonstrations", IEEE Journal on Selected Areas in Communications, vol. 8, No. 6, Aug. 1990, pp. 995 of 1004.

C. A. Turkatte, "Examining the Benefits of Turnable Lasers for Provisioning Bandwidth on Demand", EuroForum—Optical Components, Feb. 2001, pp. 1 of 10.

R. Plastow, "Turnable Lasers and Future Optical Networks", Forum—Turnable Laser, Aug. 2000, pp. 52 of 62.

Elizabeth Bruce, "Turnable Lasers", Communications, IEEE Spectrum, Feb. 2002, pp. 35 of 39.

M. G. Littman et al., "Spectrally Narrow Pulsed Dye Laser without Beam Expander", Applied Optics, vol. 17, No. 14, Jul. 15, 1978, pp. 2224 of 2227.

Development of Digital MEMS–Based Display Technology Promises Improved Resolution, Contrast, and Speed, XP–000730009, 1997, pp. 33 of 34.

"Micromachined Opto/Electro/Mechanical Systems," Electronic Systems, NASA Tech Briefs, Mar. 1997, pp. 50 & 52.

S.T. Pai, et al., "Electomigration in Metals", Received Jun. 4, 1976, pp. 103–115.

Olga B. Spahn, et al., "High Optical Power Handling of Pop–Up Microelectromechanical Mirrors", Sandia National Laboratories, IEEE 2000, pp. 51–52.

David M. Burns, et al., "Optical Power Induced Damage to Microelectromechanical Mirrors", Sensors and Actuators A 70, 1998, pp. 6–14.

E. Hecht, "Optics", Addison–Wesley, $2^{nd}$ edition, 1987, Adelphi University, pp. 163–169, 358–360.

T. Glaser et al., "Beam switching with binary single–order diffractive grating", XP–000802142, Optics Letters, Dec. 15, 1998, vol. 23, No. 24, pp. 1933 of 1935.

P. C. Kundu et al., "Reduction of Speckle Noise by Varying the Polarisation of Illuminating Beam", XP–002183475, Dept. of Applied Physics, Calcutta University, 1975, pp. 63–67.

J. W. Goodman, "Some Fundamental Properties of Speckle", XP–002181682, Dept. of Electrical Engineering, Stanford University, 1976, pp. 1146–1150.

Lingli Wang et al., "Speckle Reduction in Laser Projection Systems by Diffractive Optical Elements", XP–000754330, Applied Optics, Apr. 1, 1998, vol. 37, No. 10, pp. 1770–1775.

R.W. Corrigan et al., "Calibration of a Scanned Linear Grating Light–Valve, Projection System for E–Cinema Applications", Silicon Light Machines, SID'99, San Jose, CA, 27 pags, 1999.

R.W. Corrigan et al., "Calibration of a Scanned Linear Grating Light–Valve, Projection System", Silicon Light Machines, San Jose, CA, 4 pgs, May 18, 1999.

"Introduction to Cryptography", http://www.ssh.fi/tech/crpto/into.html, 35 pgs, Jun. 21, 1999.

"Deep Sky Black," Equinox Interscience, www.eisci.com/deepsky.html, 1997.

"Absorptive Neutral Density Filters," Newport Corp., Irvine, CA, www.newport.com, May 7, 1999.

"High Energy Variable Attenuators," Newport Corp., Irvine, CA, www.newport.com, May 7, 1999.

"Neutral–Density Filters," New Focus, Inc., Santa Clara, CA, www.newfocus.com, May 7, 1999.

J. Hawkes et al., "Laser Theory and Practice," Prentice Hall, New York, 1995, pp. 407–408.

Claude, T. et al., "Electronic Control of a Digital Micromirror Device for Projection Displays", Proceedings of the 1994 IEEE International Solid–State Circuits Conference, 1994.

Henck, S.A., "Lubrication of Digital Micromirror Devices™", Tribology Letters, No. 3, pp. 239–247, 1997.

K. W. Gloossen et al., "Silicon Modulator Based on Mechanically–Active Anti–Reflection Layer with 1 Mbit/sec Capability for Fiber–in–the–Loop Applications", IEEE Protonics Technology Letters, vol. 6, No. 9, Sep. 1994, pp. 1119–1121.

J. A. Walker et al., "Demonstration of a Gain Flattened Optical Amplifier with Micromechanical Equalizer Element", Lucent Technologies, pp. 13–14.

A. P. Payne et al., "Resonance Measurements of Stresses in $Al/Si_3N_4$ Micro–Ribbons", Silicon Light Machines, Sep. 22, 1999, 11 pgs.

M. W. Miles, "A New Reflective FPD Technology Using Interferometric Modulation", 4 pgs.

N. A. Riza et al., "Digitally Controlled Fault–Tolerant Multiwavelength Programmable Fiber–Optic Attenuator Using a Two–Dimensional Digital Micromirror Device", Optics Letters, Mar. 1, 1999, vol. 24, No. 5, pp. 282–284.

N. A. Riza et al., "Synchronous Amplitude and Time Control for an Optimum Dynamic Range Variable Photonic Delay Line", Applied Optics, Apr. 10, 1999, vol. 38, No. 11, pp. 2309–2318.

P. Alvelda et al., "44.4: Ferroelectric Microdisplays Using Distortion–Compensated Pixel Layouts", SID 95 Digest, XP 2020715, pp. 931–933.

* cited by examiner

US 6,767,751 B2

INTEGRATED DRIVER PROCESS FLOW

FIELD OF THE INVENTION

The present invention relates to a method of and an apparatus for integration of a light modulator and device drivers. More particularly, this invention is for monolithically integrating a diffractive light grating and associated device drivers on the same chip.

BACKGROUND OF THE INVENTION

A diffractive light grating is used to modulate an incident beam of light. One such diffractive light grating is a grating light valve. Device drivers provide control signals to the grating light valve which instruct the grating light valve to appropriately modulate the light beam incident thereto. The grating light valve is connected to the device drivers via wire bonds, where each wire bond is connected to one bond pad on the grating light valve and a corresponding bond pad on the device drivers. A conventional grating light valve assembly, as illustrated in FIG. 1, consists of a grating light valve chip 10 and four separate driver die 12, 14, 16 and 18. Each driver die 12, 14, 16 and 18 is coupled to the grating light valve chip 10 by a plurality of wire bonds 11. The grating light valve is built on its own process on silicon. The grating light valve includes moveable elements and each element is connected to a corresponding bond pad. The grating light valve is an essentially passive device where voltage is applied to make the elements move. In contrast, the device drivers are active. Each of the device drivers includes a plurality of transistors with appropriate layers of interconnects. The device drivers receive digital data and convert it to an analog response in the form of analog voltage. The analog voltage is then applied to the appropriate bond pad, which is then received by the corresponding element on the grating light valve. In this manner, the device drivers provide control signals to the grating light valve, thereby dictating the movement of the various elements.

In the field of light modulating devices, each element on the grating light valve corresponds to a pixel within the light modulating device. For example, in the case of 1088 pixels, 1088 wire bonds are needed as input to the grating light valve from the device drivers. 1088 wire bonds requires 272 bond pads on the output side of each of the four device drivers. However, it is much easier to perform high density wiring using standard semiconductor processing steps then it is to do wire bonding. Since only 60–70 wire bonds are necessary on the input side of each of the device drivers, it would be advantageous to internally wire the connections between the device drivers and the grating light valve on the same chip. In this manner, it would only be necessary to have the 60–70 wire bonds as inputs to this integrated chip, thereby eliminating the additional 1088 wire bonds of the conventional grating light valve assembly. By reducing the number of wire bonds, the manufacturing process is made easier. Further, fewer wire bonds reduces the packaging cost of each device. Still further, by eliminating the wire bonds between the device drivers and the grating light valve, types of device driver designs whose functionality and/or speed was previously limited by the parasitic capacitance of the wire bonds can now be used.

There is also a reliability problem associated with such a high number of wire bonds. Since there is a finite failure rate associated with each wire bond, the more wire bonds there are, the greater the chance that one of the wire bonds will fail. Reducing the number of wire bonds would necessarily reduce the number of failing wire bonds, and increase the reliability of the device.

Physically, each bond pad leaves a footprint. As such, the size of the grating light valve assembly is determined in great part by the total number of bond pads. If the number of bond pads is reduced, the size of the grating light valve assembly can also be reduced. As the device is bond pad limited, there is a significant amount of wasted real estate. Since this wasted real estate exists on silicon which can be used to manufacture the device drivers, the device drivers could be manufactured on the real estate currently being used by the bond pads.

Electro-static discharge (ESD) protection is usually incorporated into active devices ranging from diodes to transistors and integrated circuits. It is a matter of layout and design to add ESD protection structures to the pad during transistor fabrication on the integrated circuits. This protection prevents the circuitry from being damaged by ESD. However, since there is no active device on the grating light valve chip, there is no ESD protection. As a result, a significant amount of yield is lost during manufacturing of the grating light valves due to ESD induced "snap-downs." In a snap-down, the pad on the grating light valve acts as an antenna and sees an ESD event. The ESD event is regarded as a voltage by the element on the grating light valve and the element is snapped down thereby destroying itself. It would be advantageous to incorporate ESD protection into the normal manufacturing process of the grating light valve.

Considering the above shortcomings, it is clear that if the device drivers are integrated onto the same silicon monolithically with the grating light valve, then this would produce a significant advantage.

Unfortunately, the manufacturing processes of the device drivers and the grating light valve are not the same. Further, by integrating the device drivers and the grating light valve onto the same silicon substrate, significant manufacturing problems are introduced.

Conventional transistor manufacturing processes are described below in relation to FIGS. 2 and 3. FIG. 2 illustrates an exemplary transistor used in the device drivers of the grating light valve assembly. The transistor illustrated in FIG. 2 is early in the manufacturing process and is often referred to as the front-end of the transistor. In a first step, silicon dioxide films 22 are grown on a silicon substrate 20. Next, a gate 24 and source-drain 26 are added by manufacturing processes that are well known in the art of semiconductor fabrication. A next step, as illustrated in FIG. 3, is deposition of an oxide layer 30 over the front-end of the transistor. The oxide layer 30 is then planarized, typically by a chemical-mechanical polishing technique. Contact holes are then etched in the oxide layer 30 to access the gate 24 and the silicon substrate 20, for example. Metalization is performed for the wiring of the device drivers. Metalization is typically performed by sputtering a metal layer over the oxide layer 30, patterning and etching the metal layer to form contacts 32 and 34.

Another oxide layer 36 is then deposited and planarized. Contact holes are etched in the oxide layer 36 to access the contacts 32 and 34. Metalization is then performed to form the contacts 38 and 40. Additional layers of oxide and metalization are added as determined by the design considerations of the device. Typically, there are 3–5 layers of metal which form the interconnects of the device drivers.

Conventional grating light valve manufacturing processes are described below in relation to FIGS. 4–7. The first step, as illustrated in FIG. 4, is the deposition of an insulating layer 51 followed by the deposition of a sacrificial layer 52 and a low-stress silicon nitride film 54 on a silicon substrate 56.

In a second step, as illustrated in FIG. 5, the silicon nitride film 54 is lithographically patterned into a grid of grating elements in the form of elongated elements 58. After this lithographic patterning process, a peripheral silicon nitride frame 60 remains around the entire perimeter of the upper surface of the silicon substrate 56. After the patterning process of the second step, the sacrificial layer 52 is etched, resulting in the configuration illustrated in FIG. 6. It can be seen that each element 58 now forms a free standing silicon nitride bridge. As can further be seen from FIG. 6, the sacrificial layer 52 is not entirely etched away below the frame 60 and so the frame 60 is supported above the silicon substrate 56 by this remaining portion of the sacrificial layer 52.

The last fabrication step, as illustrated in FIG. 7, is sputtering of an aluminum film 62 to enhance the reflectance of both the elements 58 and the substrate 56 and to provide a first electrode for applying a voltage between the elements and the substrate. A second electrode is formed by sputtering an aluminum film 64 onto the base of the silicon substrate 56. Alternatively, the second electrode can be introduced earlier in the process by sputtering an aluminum film onto the upper portion of the silicon substrate 56 prior to deposition of the insulating layer 51.

In FIGS. 8 and 9, an alternative embodiment of a conventional grating light valve is illustrated. In this embodiment the grating light valve consists of a plurality of equally spaced, equally sized, fixed elements 72 and a plurality of equally spaced, equally sized, movable elements 74 in which the movable elements 74 lie in the spaces between the fixed elements 72. Each fixed element 72 is supported on and held in position by a body of supporting material 76 which runs the entire length of the fixed element 72. The bodies of material 76 are formed during a lithographic etching process in which the material between the bodies 76 is removed.

The problem is how to manufacture the grating light valve on the same chip as the transistors that comprise the device drivers. Combining a grating light valve and its associated device drivers onto a monolithically integrated device using conventional manufacturing process steps would be advantageous.

SUMMARY OF THE INVENTION

The present invention includes an embodiment of a method of fabricating an integrated device. The method preferably comprises fabricating a front-end portion for each of a plurality of transistors, isolating the front-end portions of the plurality of transistors, fabricating a front-end portion of a diffractive light modulator, isolating the front end portion of the diffractive light modulator, fabricating interconnects for the plurality of transistors, applying an open array mask and wet etch to access the diffractive light modulator, and fabricating a back-end portion of the diffractive light modulator, thereby monolithically coupling the diffractive light modulator and the plurality of transistors. The plurality of transistors and the associated interconnects can form one or more device drivers configured to process received control signals and to transmit the processed control signals to the diffractive light modulator. Fabricating the front-end portion of the diffractive light modulator and fabricating the front-end portions for the plurality of transistors can be performed using high temperature processing steps. Fabricating interconnects and fabricating the back-end portion of the diffractive light modulator can be performed using low temperature processing steps. Isolating the front-end portions of the plurality of transistors can include depositing an oxide layer over the front-end portions of the plurality of transistors, and planarizing the oxide layer. Isolating the front-end portion of the diffractive light modulator can include depositing an oxide layer over the front-end portion of the diffractive light modulator, and planarizing the oxide layer.

Fabricating the interconnects can include fabricating one or more metal layers. The preferred method can also include removing metal from above the diffractive light modulator after each metal layer is fabricated. Each metal layer can be removed from above the diffractive light modulator by over-etching and the oxide layer deposited over the front-end portion of the diffractive light modulator is sufficiently thick as to allow for over-etching without damaging the front-end portion of the diffractive light modulator. The interconnects for the plurality of transistors can include contacts to each of the plurality of transistors. The contacts can include a maximum aspect ratio that limits a maximum combined thickness of the oxide layer over the front-end portions of the plurality of transistors and the oxide layer over the front-end portion of the diffractive light modulator. The diffractive light modulator and the plurality of transistors are monolithically coupled to transmit control signals from the plurality of transistors to the diffractive light modulator such that the diffractive light modulator modulates an incident light beam in response to the control signals. The wet etch preferably comprises about a 10:1 buffered oxide wet etch to selectively etch the layers above the diffractive light modulator.

The present invention includes an embodiment of an integrated device. The integrated device includes one or more device drivers and a diffractive light modulator monolithically coupled to the one or more driver circuits. The one or more driver circuits are preferably configured to process received control signals and to transmit the processed control signals to the diffractive light modulator.

DETAILED DESCRIPTION OF THE EMBODIMENTS

The fabrication steps required to produce a monolithically integrated diffractive light grating and device drivers according to the preferred embodiment of the present invention are illustrated in FIGS. 10–20. Specifically, the fabrication process begins with a front-end fabrication process, which is illustrated in FIGS. 10–14. The fabrication process is completed with a back-end fabrication process, which is illustrated in FIGS. 15–20. The front-end fabrication process includes fabrication of the front-end of the transistors, which form the device drivers and fabrication of the front-end of the diffractive light grating. The fabrication of the front-end of the transistors and the front-end of the diffractive light grating are performed using high-temperature process steps. The back-end fabrication process includes the metalization of the transistor interconnects and the metalization of the diffractive light grating. Metalization is performed using low-temperature process steps. The total thermal budget associated with the fabrication of the monolithically integrated device must take into consideration the thermal budgets associated with each of the high-temperature process steps as well as each of the low-temperature process steps.

Figure 1:
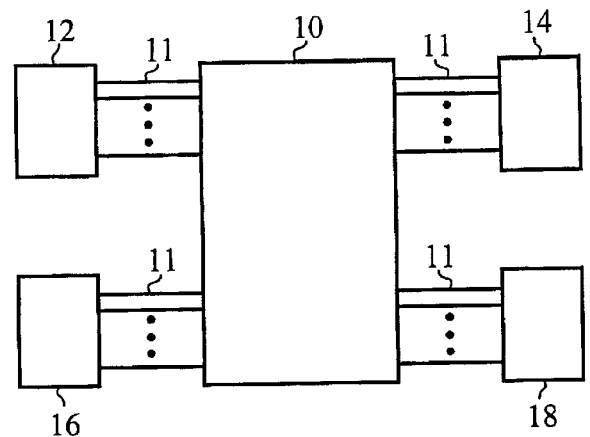
FIG. 1 illustrates a conventional component configuration in which a diffractive light grating is connected to separate device drivers.
Figure 2:
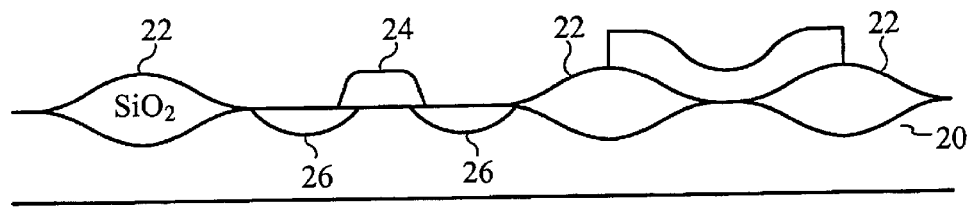
FIG. 2 illustrates an exemplary transistor configuration without interconnects.
Figure 3:
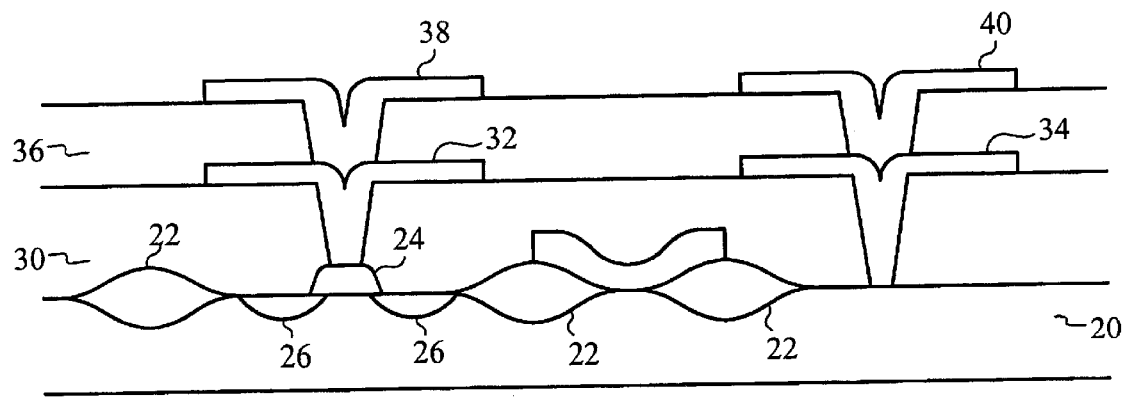
FIG. 3 illustrates the exemplary transistor configuration of FIG. 2 with interconnects.
Figure 4:
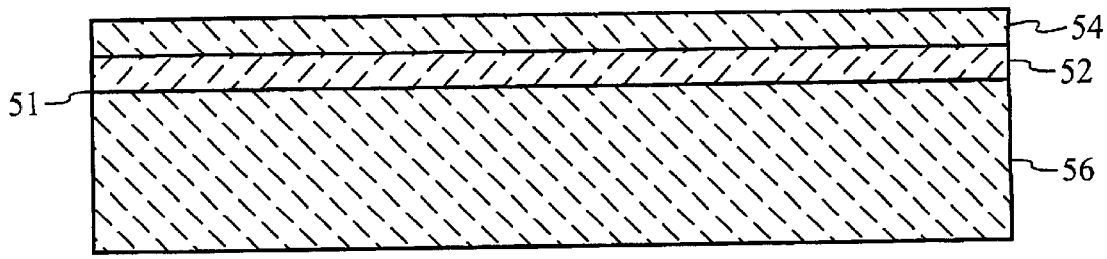
FIGS. 4–7 are cross-sections through a silicon substrate illustrating the manufacturing process of a conventional reflective, deformable, diffraction light grating.
Figure 5:
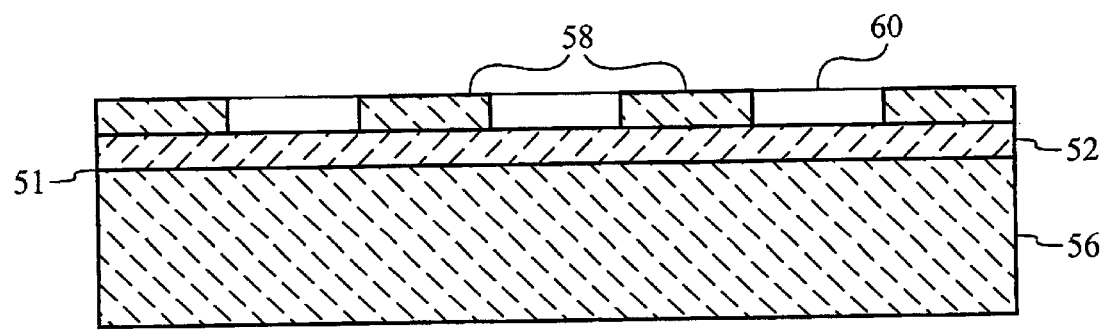
Figure 6:
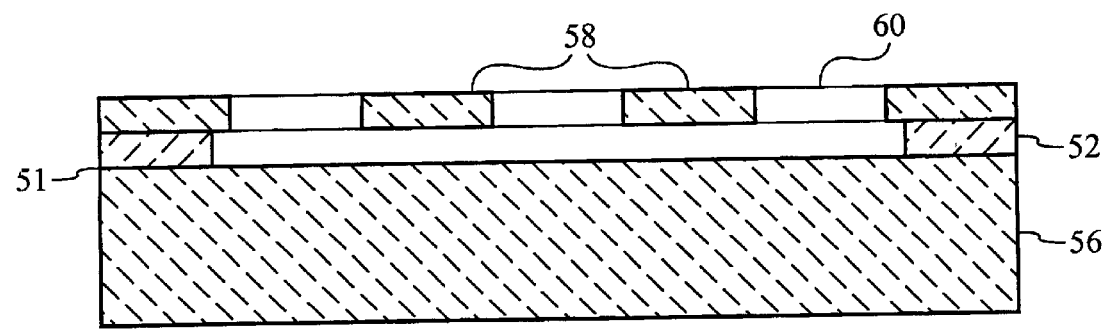
Figure 7:
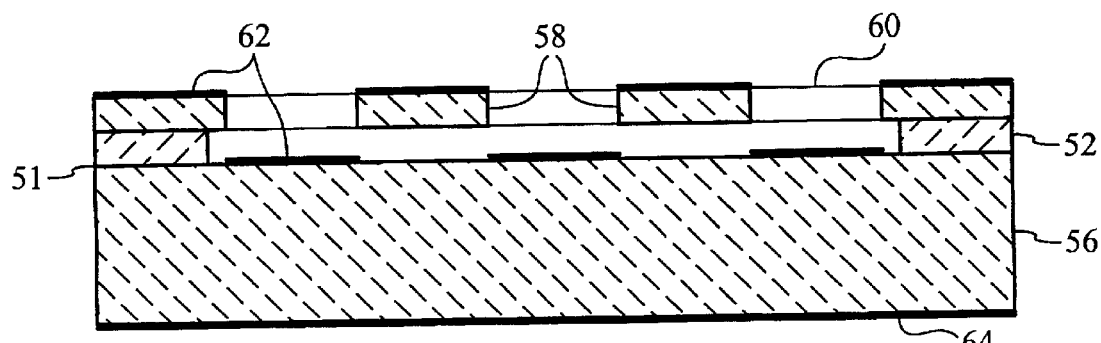
Figure 8:
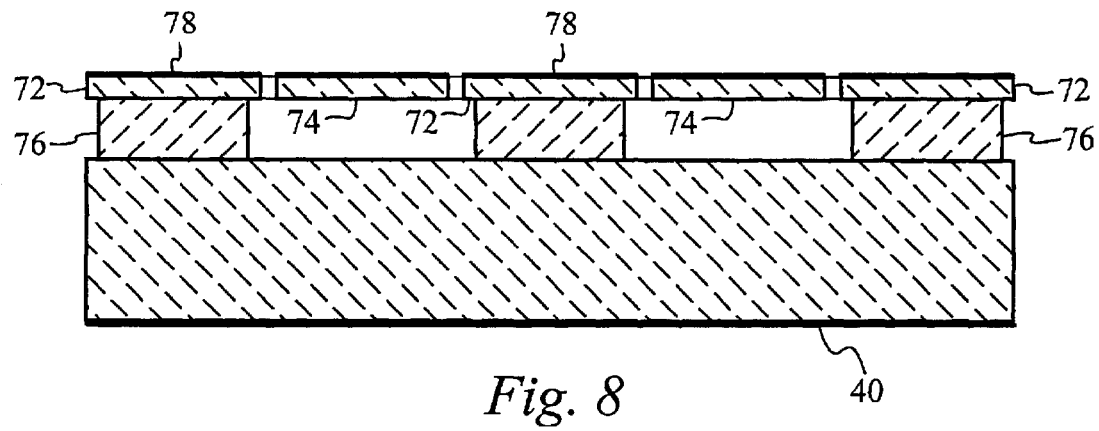
FIG. 8 is a cross-section similar to that in FIG. 7, illustrating an alternative embodiment of a conventional diffractive light grating in a non-diffracting mode.
Figure 9:
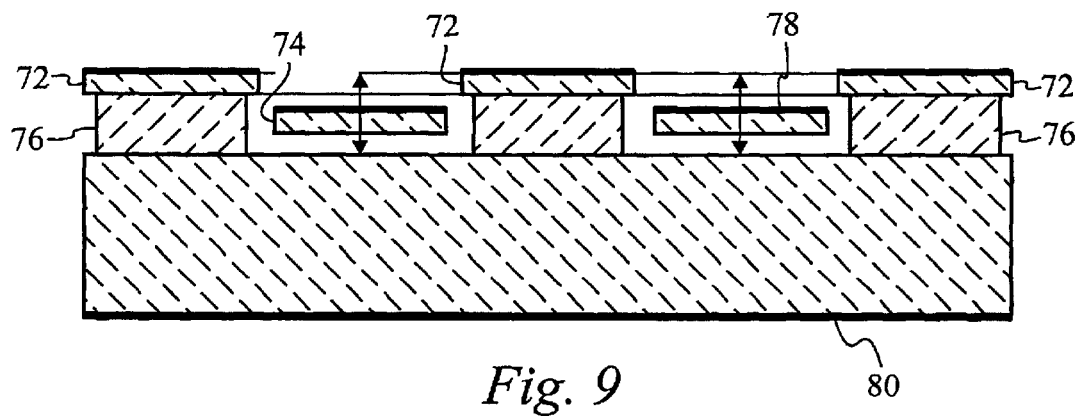
FIG. 9 is a cross-section of the diffractive light grating shown in FIG. 8, illustrating the diffractive light grating in a diffracting mode.
Figure 10:
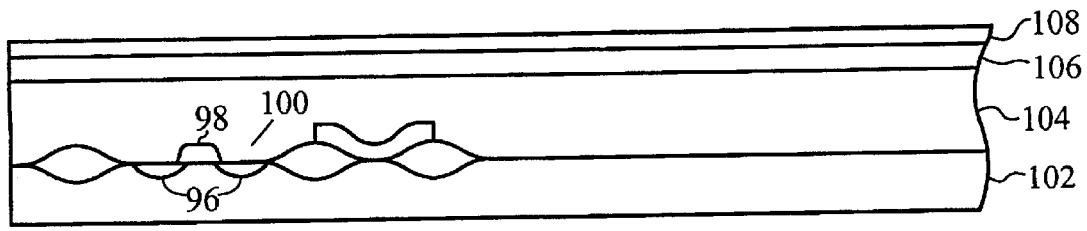
FIGS. 10–14 are cross-sections through a silicon substrate illustrating the front-end fabrication process of a monolithically integrated device according to the preferred embodiment of the present invention.

The first step in the front-end fabrication process, as illustrated in FIG. 10, is the fabrication of the front-end of a conventional MOS transistor 100. The MOS transistor 100 can be a p-type transistor or an n-type transistor. The transistor 100 is fabricated using conventional fabrication steps similar to those described above in relation to FIGS. 2 and 3. The transistor 100 includes a gate 98 and source-drains 96 fabricated onto silicon substrate 102. The configuration of transistor 100 as illustrated in FIGS. 10–20 is for illustrative purposes only and should not limit the scope of the present invention. Alternative conventional transistor configurations can be used in addition to or in replace of the transistor 100.

Following the fabrication of the front-end of transistor 100 onto the silicon substrate 102 is the deposition of an oxide layer 104 on the transistor 100 and silicon substrate 102. The oxide layer 104 is then planarized, where the thickness of the oxide layer 104 is a minimum amount sufficient for adequate planarization. The preferred method of planarizing the oxide layer 104, and subsequent oxide layers, is by chemical-mechanical polishing (CMP). Alternatively, any conventional method of planarizing can be used. As a result of the deposition and planarization of the oxide layer 104, the transistor 100 is sealed in a protective layer of oxide. Since the wafer is planar at this step, the wafer is in a desirable condition to begin fabrication of a front-end of the grating light valve. If, instead, the fabrication of the grating light valve is started directly on the transistor topology without first protecting the transistor 100 with the oxide layer 104, then the transistor 100 would most likely become damaged. Even if the transistor 100 were not damaged, significant processing difficulties would arise. These difficulties include removing the film from sidewalls of the various transistor elements. Removing the thin film from sidewalls can result in plasma damage, roughering of oxide, and other deleterious effects. Overcoming these difficulties, and others, adds complexity to the grating light valve fabrication process. By isolating the transistor 100 within the protective layer of oxide, potential damaging aspects of the grating light valve fabrication process are eliminated.

Figure 11:
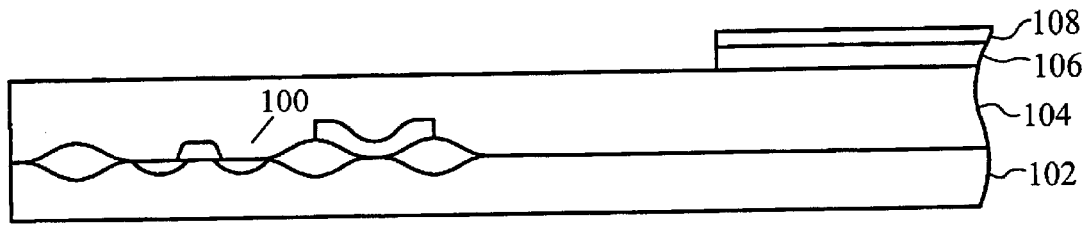

The next step is the deposition of a doped poly silicon layer on the oxide layer 104, followed by the deposition of an insulating layer, typically an oxide, on the doped poly silicon. Once patterned and etched, the poly silicon layer forms a bottom electrode 106 of the grating light valve, and the insulating layer forms an etch stop 108, as illustrated in FIG. 11.

Figure 12:
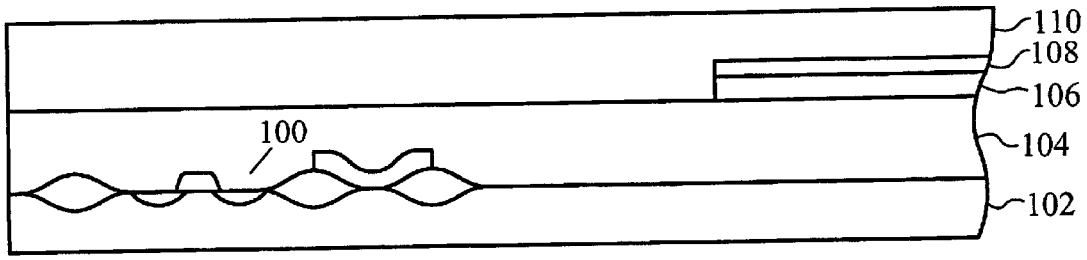
Figure 13:
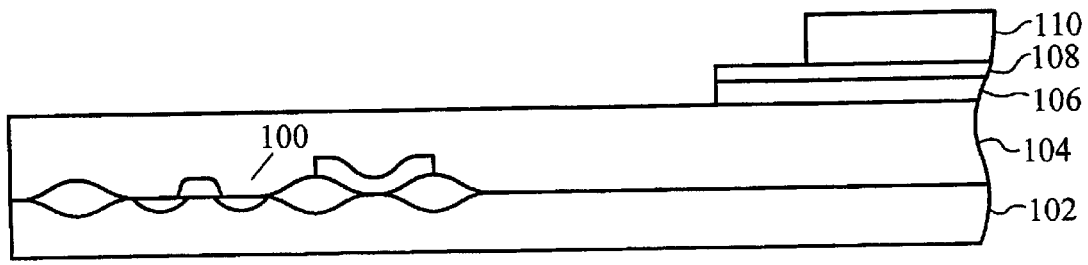
Figure 14:
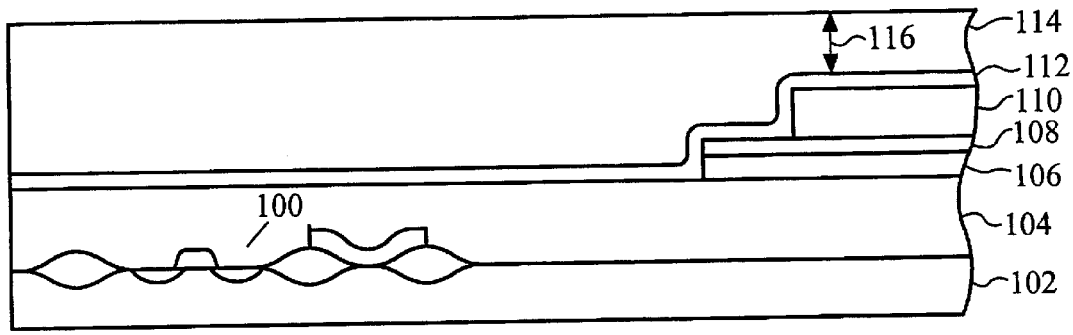

The next step, as illustrated in FIG. 12, is the deposition of a sacrificial layer 110. The sacrificial layer is then patterned and etched, as illustrated in FIG. 13. The next step, as illustrated in FIG. 14, is the deposition of a silicon nitride layer 112. The silicon nitride layer 112 is lithographically patterned into a grid of grating elements, the form of which is dependent upon the specifications of the particular grating light valve necessary to perform the desired modulation of a light beam incident thereto. The FIGS. 10–18 illustrate a representative cross-section of the grating light valve, and more particularly, an edge portion of the grating light valve. It should be clear that this cross-section is exemplary only and is intended to aid in the understanding of the fabrication process. After this lithographic patterning process, a silicon nitride frame remains which acts as a relatively rigid support structure for some or all of the grating elements of the grating light valve.

The next step is the deposition of an oxide layer 114, which is then planarized. The oxide layer 114 is preferably planarized by CMP. As a result of the deposition and planarization of the oxide layer 114, the grating light valve is embedded in a protective layer of oxide. It is necessary that the oxide layer 114 is of a minimum thickness 116 so that a subsequent over-etching step can be performed without damaging the silicon nitride layer 112. This over-etching step will be described in greater detail below. This completes the front-end fabrication process.

As described above, the front-end fabrication of the transistor and the front-end fabrication of the grating light valve are performed using high-temperature processing steps. Preferably, in the front-end of the transistor, the silicon dioxide films are grown 800–1200 degrees C., the deposition of the gate is performed at 550–650 degrees C., and the source-drains are annealed at 800–1200 degrees C. The anneal temperature is determined based on the total thermal budget of the device fabrication process. To determine the anneal temperature, the thermal budget of the low-temperature processes associated with the back-end fabrication, and the thermal budget of the grating light valve front-end fabrication processes are determined and subtracted from the total thermal budget. The result is the front-end transistor thermal budget. The anneal temperature is then determined based on the front-end transistor thermal budget. In the front-end of the grating light valve, the deposition of the doped ploy silicon layer is performed at 550–650 degrees C. with a short anneal at 800–1200 degrees C., the deposition of the insulating layer is performed at 800–1200 degrees C., the deposition of the sacrificial layer is performed at 550–650 degrees C., and the deposition of the silicon nitride layer is performed at 700–900 degrees C. Each of the aforementioned temperature ranges are approximations. Each of the aforementioned deposition steps are preferably performed using low pressure chemical vapor deposition, or LPCVD. The preferred temperature ranges are the recommended temperature ranges for the processes described above. It is understood that other processes can be used to fabricate this or other types of transistors, where the other processes used are known to be conducted at different temperature ranges.

Figure 15:
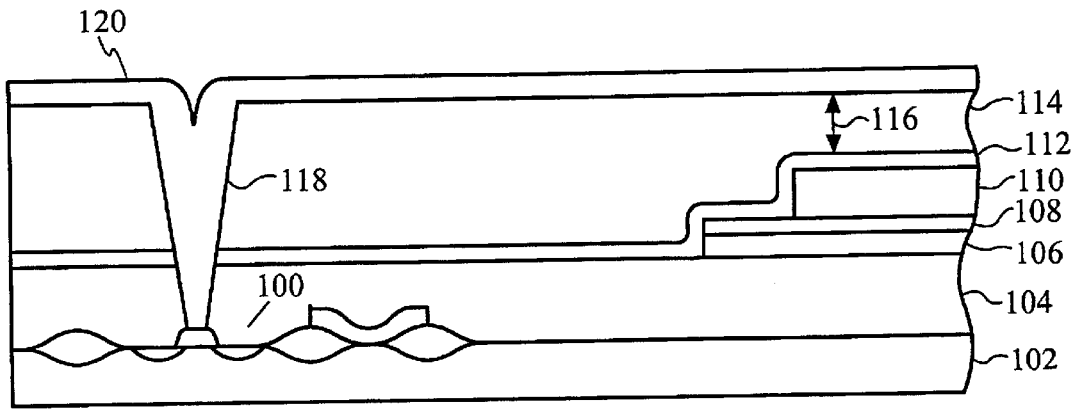
FIGS. 15–20 are cross-sections similar to that in FIGS. 10–14, illustrating the back-end fabrication process of the monolithically integrated device according to the preferred embodiment of the present invention.

The first step in the back-end fabrication process, as illustrated in FIG. 15, is the patterning and etching of a contact hole 118 to access the gate 98 of the transistor 100.

The contact hole 118 includes an aspect ratio with a defined maximum, as is well known in the art. The maximum aspect ratio limits the maximum depth of the contact hole 118. It is a design consideration to account for this maximum depth when determining the thickness of the oxide layer 104 and the oxide layer 114, such that the depth of the contact hole 118 does not exceed the maximum depth permitted by the maximum aspect ratio of the contact hole 118. Following the etching of the contact hole 118 is the sputtering of a metal layer 120. Preferably, the metal is aluminum although other conductive metals can be used.

Figure 16:
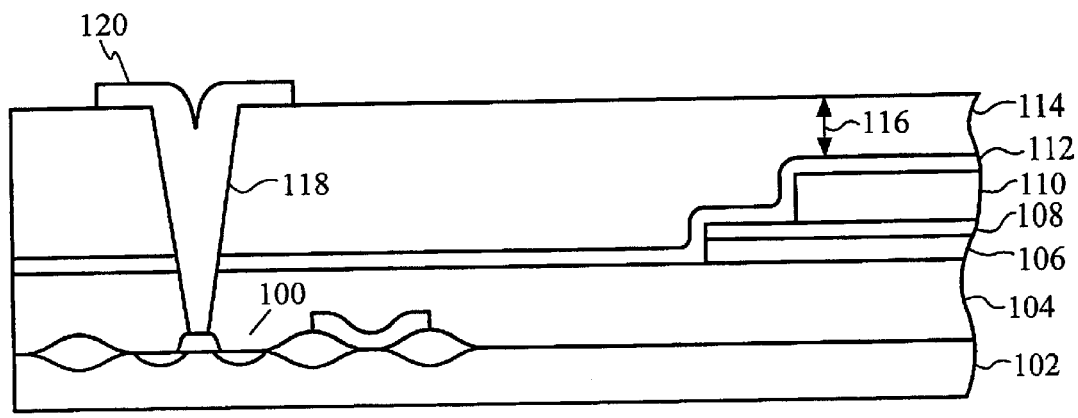

The next step, as illustrated in FIG. 16, is the patterning and etching of the metal layer 120 to form the first metal layer of an interconnect to transistor 100. Etching of the metal layer 120 is also necessary to remove the metal from the area above the grating light valve. To ensure that all of the metal layer 120 that is not the interconnect is removed, over-etching into the oxide layer 114 is performed. Thus the need for the minimum oxide thickness 116 of the oxide layer 114 over the grating light valve. The oxide thickness 116 acts as a buffer zone to allow for over-etching of the metal layer 120 without damaging the silicon nitride layer 112 of the grating light valve. It should be clear that after the over-etching step is performed, the oxide thickness 116 is less than that before the over-etching step is performed.

Figure 17:
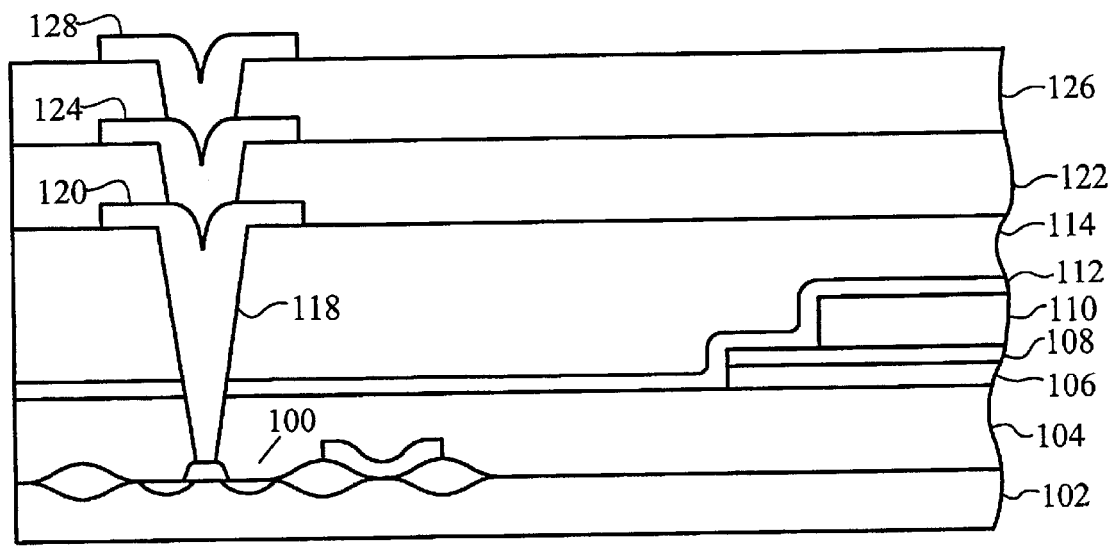

The next step, as illustrated in FIG. 17, is the deposition of an oxide layer 122. The oxide layer 122 is then planarized. The oxide layer 122 is preferably planarized by CMP. A contact hole is then patterned and etched to access the metal interconnect 120. Sputtering of another metal layer is then performed, which is then patterned and over-etched to form the second metal layer 124 of the interconnect to the transistor 100. As above, over-etching also removes the metal layer from the area above the grating light valve. Following the fabrication of this second metal layer, a third metal layer is fabricated by repeating the steps of depositing an oxide layer (oxide layer 126), planarizing the oxide layer (preferably by CMP), patterning and etching a contact hole (to access the metal layer 124), sputtering a metal layer, patterning and over-etching the metal layer. In this manner, the third metal layer 128 is formed and the area above the grating light valve is cleared of metal. The metal layers 120, 124 and 128 form an interconnect between the surface of the device and the gate 98 of the transistor 100. Although the interconnect illustrated in FIG. 17 consists of three metal layers, it should be clear to those skilled in the art that an interconnect can include more or less metal layers as necessary. Preferably, 3–5 metal layers are used to form the interconnects. These metalization layers are fabricated using low-temperature processing steps, as are well known in the art.

Figure 18:
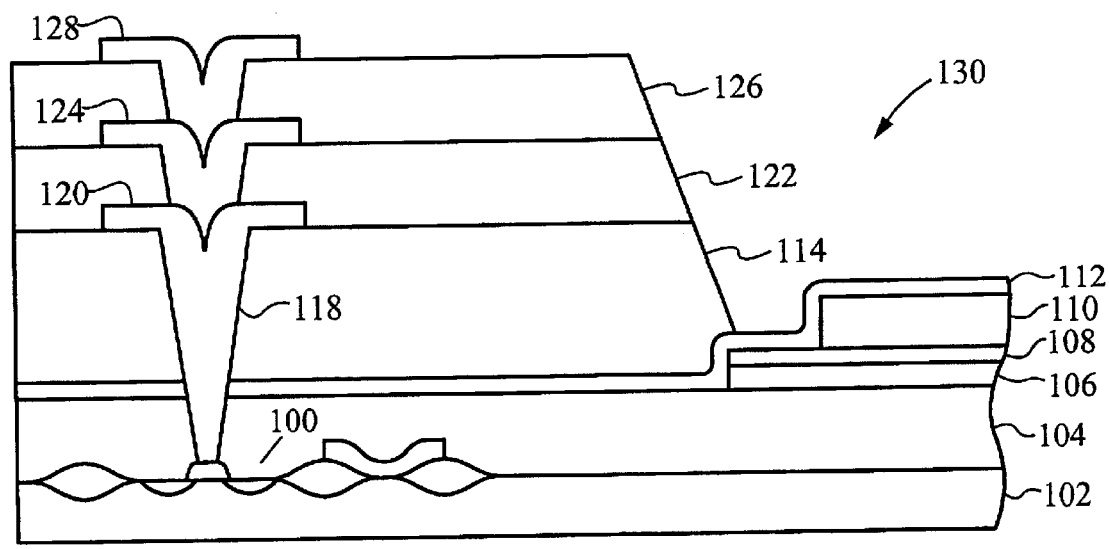

Once the interconnects for the transistor 100 are completed, all material above the grating light valve is to be removed. This step, as illustrated in FIG. 18, is accomplished by applying a mask called an open array mask. The open array mask acts to protect the transistor 100 and associated interconnects while enabling the material above the grating light valve to be removed. To remove the material above the grating light valve, a wet dip is used. Preferably, the wet dip is a buffered oxide etch (BOE) wet etch. More preferably, the wet dip is a selective 10:1 BOE wet etch. Alternatively, the wet dip can be a 20:1 BOE wet etch, a 50:1 hydrofluoric (HF) wet etch, a pad etch, or any other similar hydrofluoric-based wet oxide etching chemistry. The wet dip enables selective etching to remove the material in an area 130 above the grating light valve. Once the wet dip is performed, the area 130 is cleared and the grating light valve is accessible.

Figure 19:
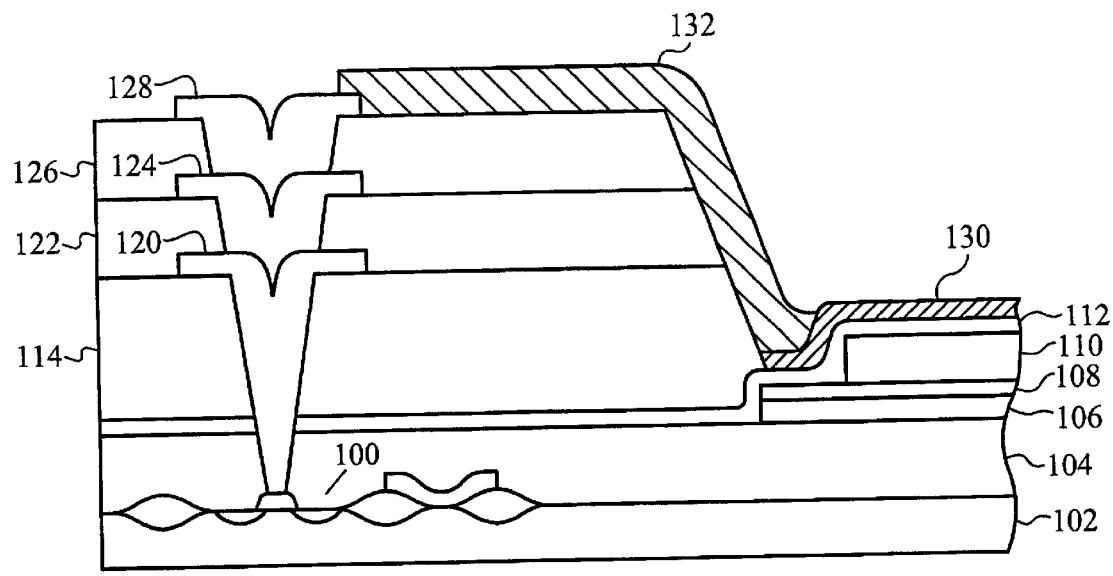
Figure 20:
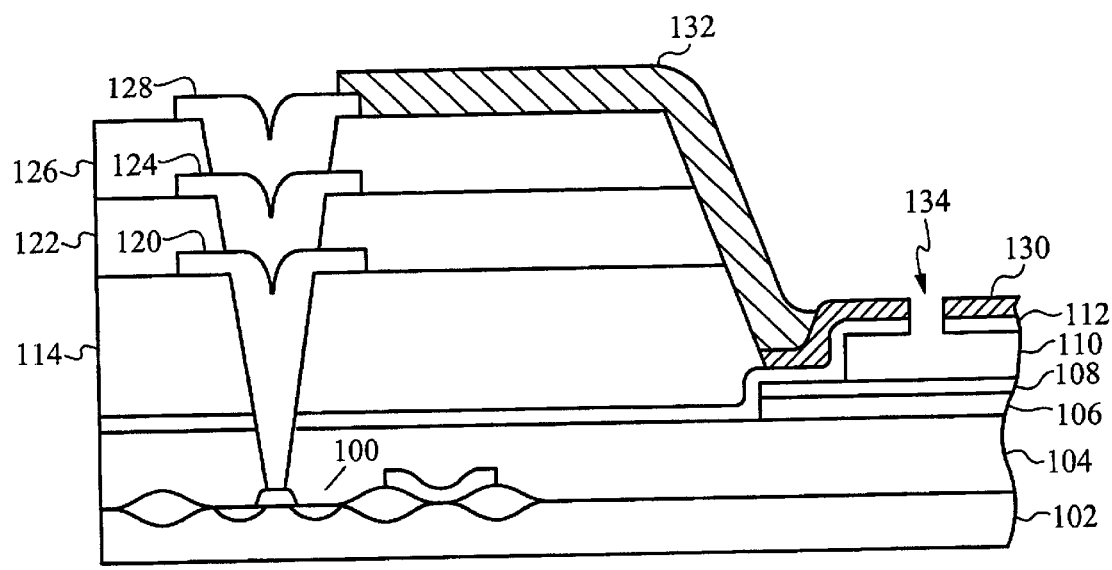

Metalization is then performed to form the reflective layers on the grating light valve as well as to provide the metal pathways between the grating light valve and the interconnects of the transistor 100. The metalization layer on the grating light valve, as well as the metal pathways, are fabricated using low-temperature processing steps, which are compatible with the low-temperature processing steps used to form the metal layers of the transistor 100. After the area 130 is cleared, metalization of the grating light valve is performed by sputtering, patterning and etching a reflective layer 130 onto the silicon nitride layer 112 of the grating light valve, as illustrated in FIG. 19. The reflective layer 130 is preferably aluminum. Then, a thick metal layer 132 is sputtered, patterned and etched to form the metal pathways between the reflective layer 130 of the grating light valve and the interconnects of the transistor 100. It is understood that any conventional method of metalizing the grating light valve and the metal pathways can be used.

The grating light valve is then completed by patterning and etching rib cuts 134 through selective areas of the reflective layer 130 and the silicon nitride 112, into which $XeF_2$ is released to remove the sacrificial layer 110. A sealing process is then performed to complete the monolithically integrated device of the present invention.

There is a need to metalize the transistor separate from metalizing the grating light valve. This is due to the nature of the wet dip used while applying the open array mask. As discussed above, the wet dip etches the oxide layers above the grating light valve down to an etch stop, which is the silicon nitride layer 112. Using one of the etching chemistries described above, the selectivity of the oxide layer to silicon nitride is extremely high, on the order of 200 to 1. This is extremely effective in etching the oxide layer down to silicon nitride layer 112. However, these etching chemistries also etch metal to a large degree, particularly the thin and high quality metal deposited on the grating light valve. Therefore, it is advantageous to not metalize the grating light valve while metalizing the transistor. If the grating light valve were metalized prior to applying the open array mask, then the etchant would etch the grating light valve metal. Instead, after the transistor interconnects are formed, the open array mask with wet dip is applied to remove the oxide layers covering the front-end of the grating light valve, and then the reflective layers of the grating light valve and the metal pathways are formed.

The monolithically integrated device and the fabrication process associated therewith has been described related to a single transistor 100. This description is for illustrative purposes only and it should be clear that the preferred embodiment of the present invention includes a plurality of transistors and associated interconnects. It should also be clear that although the present invention has been described as including a single interconnect to gate 98, additional interconnects including the interconnects to the plurality of transistors are also included as required by the design considerations of the device. Additional interconnects to the silicon substrate can also be included, for example.

I claim:

1. A method of fabricating an integrated device comprising the steps of:

a. fabricating a front-end portion for each of a plurality of transistors;

b. isolating the front-end portions of the plurality of transistors;

c. fabricating a front-end portion of a diffractive light modulator;

d. isolating the front end portion of the diffractive light modulator;

e. fabricating interconnects for the plurality of transistors;

f. applying an open array mask and wet etch to access the diffractive light modulator; and g. fabricating a back-end portion of the diffractive light modulator, thereby monolithically coupling the diffractive light modulator and the plurality of transistors.

2. The method of claim 1 wherein the plurality of transistors and the associated interconnects form one or more device drivers configured to process received control signals and to transmit the processed control signals to the diffractive light modulator.

3. The method of claim 1 wherein fabricating the front-end portion of the diffractive light modulator and fabricating the front-end portions for the plurality of transistors are performed using high temperature processing steps.

4. The method of claim 1 wherein fabricating interconnects and fabricating the back-end portion of the diffractive light modulator are performed using low temperature processing steps.

5. The method of claim 1 wherein isolating the front-end portions of the plurality of transistors comprises:

a. depositing an oxide layer over the front-end portions of the plurality of transistors; and b. planarizing the oxide layer.

6. The method of claim 1 wherein isolating the front-end portion of the diffractive light modulator comprises:

a. depositing an oxide layer over the front-end portion of the diffractive light modulator; and b. planarizing the oxide layer.

7. The method of claim 6 wherein fabricating the interconnects includes fabricating one or more metal layers.

8. The method of claim 7 further comprising removing metal from above the diffractive light modulator after each metal layer is fabricated.

9. The method of claim 8 wherein each metal layer is removed from above the diffractive light modulator by over-etching and the oxide layer deposited over the front-end portion of the diffractive light modulator is sufficiently thick as to allow for over-etching without damaging the front-end portion of the diffractive light modulator.

10. The method of claim 1 wherein the interconnects for the plurality of transistors include contacts to each of the plurality of transistors, further wherein the contacts include a maximum aspect ratio that limits a maximum combined thickness of the oxide layer over the front-end portions of the plurality of transistors and the oxide layer over the front end portion of the diffractive light modulator.

11. The method of claim 1 wherein the diffractive light modulator and the plurality of transistors are monolithically coupled to transmit control signals from the plurality of transistors to the diffractive light modulator such that the diffractive light modulator modulates an incident light beam in response to the control signals.

12. The method of claim 1 wherein the wet etch comprises about a 10:1 buffered oxide wet etch to selectively etch the layers above the diffractive light modulator.

* * * * *